(12) United States Patent
Benrashid et al.

(10) Patent No.: US 7,393,469 B2
(45) Date of Patent: Jul. 1, 2008

(54) HIGH PERFORMANCE SOL-GEL SPIN-ON GLASS MATERIALS

(76) Inventors: Ramazan Benrashid, 552 Hemmings Pl., NW., Concord, NC (US) 28269; Paul Velasco, 1003 Kenilworth Pl., Concord, NC (US) 28027

( * ) Notice: Subject to any disclaimer, the term of this patent is extended or adjusted under 35 U.S.C. 154(b) by 328 days.

(21) Appl. No.: 10/632,450

(22) Filed: Jul. 31, 2003

(65) Prior Publication Data
US 2005/0022697 A1    Feb. 3, 2005

(51) Int. Cl.
*C09K 11/02* (2006.01)
(52) U.S. Cl. ............... 252/301.36; 106/287.16; 528/15; 528/12; 528/32; 528/34
(58) Field of Classification Search ........... 252/301.36, 252/301.35; 106/287.16; 528/15, 12, 32, 528/34
See application file for complete search history.

(56) References Cited

U.S. PATENT DOCUMENTS 6,818,721 B2 * 11/2004 Zha et al. ............ 528/12

6,984,483 B1 * 1/2006 Roscher et al. ......... 430/280.1

FOREIGN PATENT DOCUMENTS

WO    WO 01/04186    *  1/2001

* cited by examiner

*Primary Examiner*—C. Melissa Koslow
(74) *Attorney, Agent, or Firm*—Andrew F. Sayko, Jr.

(57) ABSTRACT

Hybrid sol-gel materials are provided, which may be produced by the reaction of an alkyl or dialkyl substituted trialkoxysilane or dialkoxysilane reacting with a silane diol, wherein said alkyl group has from 1 to 8 carbon atoms. A process is also provided for patterning the sol-gel spin-on glass material by: a) coating a substrate with the spin-on glass material; b) exposing the coated substrate of step a) to UV illumination in a desired pattern; c) post-exposure baking the coated substrate of step b) at a temperature from 100° C. to 120° C. for 30 to 60 minutes; d) cooling the coated substrate of step c) to room temperature; e) removing the non-exposed areas of the coating on the coated substrate of step d); f) drying the coated substrate of step e); g) hard baking the coated substrate of step f) at a temperature from 120° C. and 150° C. for 1 to 3 hours.

16 Claims, 10 Drawing Sheets

$R_1$ = Alkyl ($C_1$ to $C_8$), Methacryloxyalkyl, Acryloxyalkyl, Glycidyloxyalkyl
$R_2$ = Alkyl, Substituted Alkyl, Phenyl, Substituted phenyl, Methoxy, Ethoxy
$R_3$ = Methyl, Methoxy, Ethoxy, Alkoxy
$R_4$ = Methoxy, Ethoxy, Alkoxy

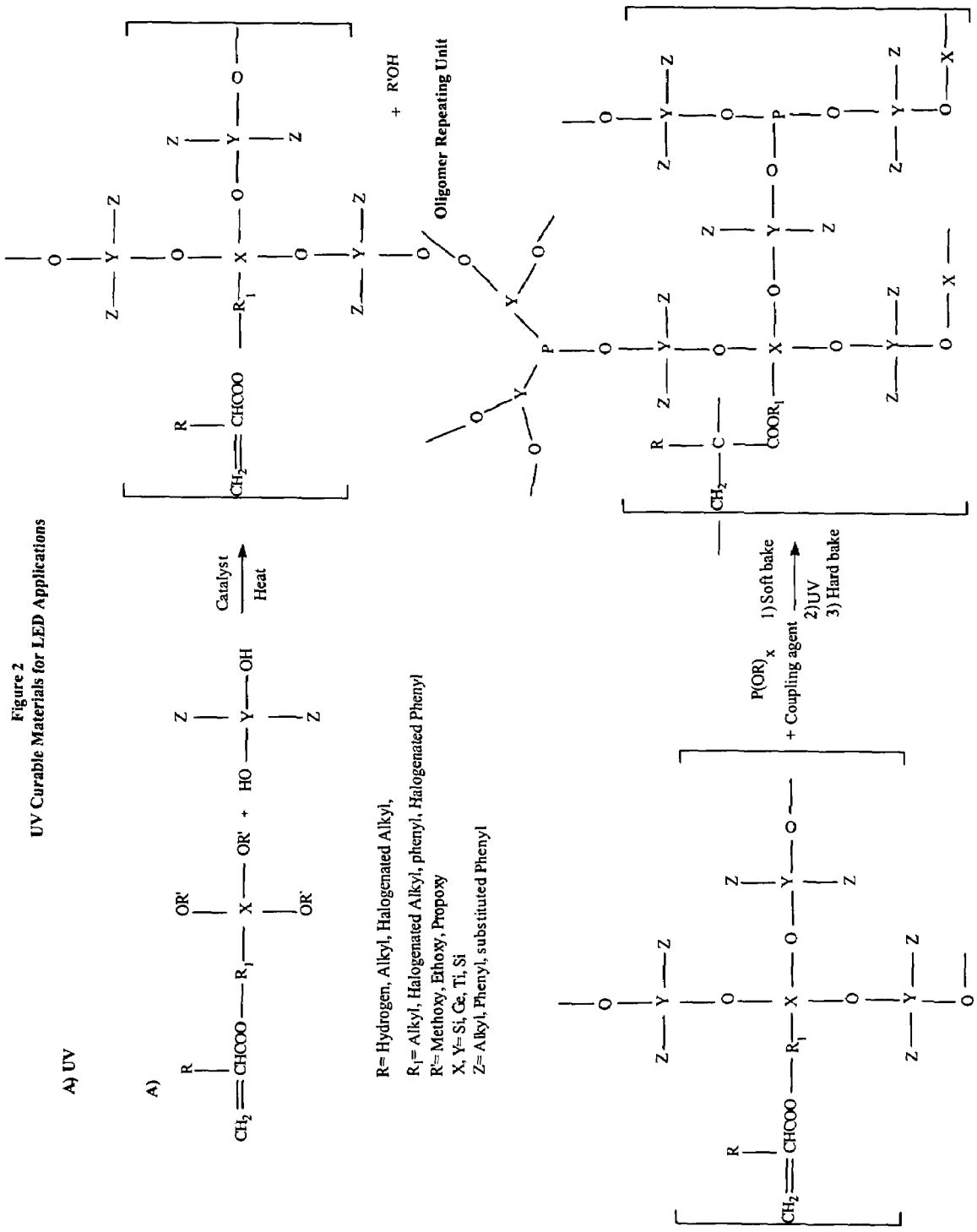

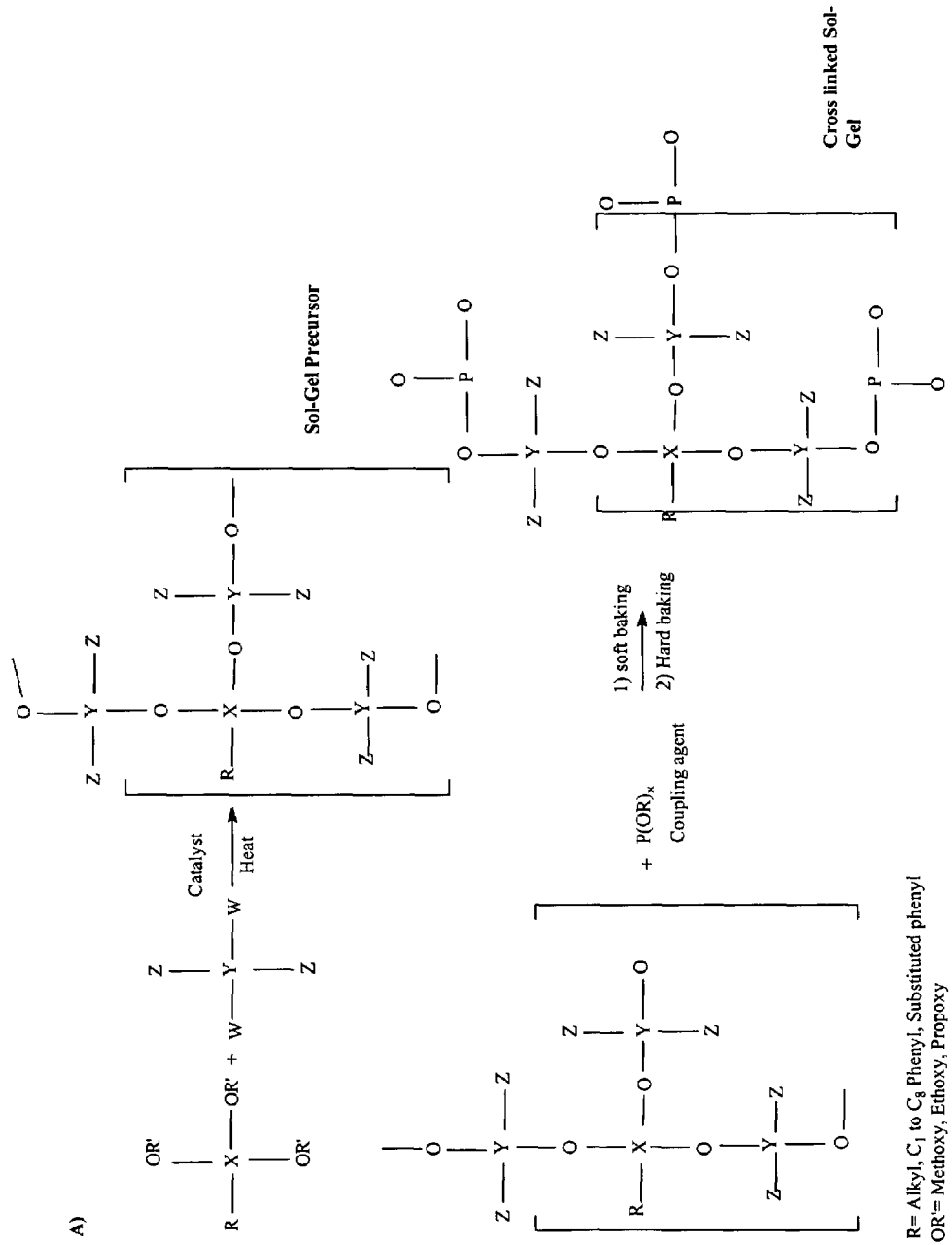

$R_1$ = Phenyl, Propyl, Ethyl, Trifluoropropyl
$R_2$ = Methyl, Ethyl
OR' = Methoxy, Ethoxy, Propoxy, Butoxy
X, Y = Si, Ge, Ti, Sn
Z = Alkyl, substituted Alkyl, Phenyl, Substituted Phenyl

HIGH PERFORMANCE SOL-GEL SPIN-ON GLASS MATERIALS

FIELD OF THE INVENTION

The present invention relates to a new sol-gel spin-on glass (SOG) material especially suitable for use with a light-emitting device, such as a light-emitting diode (LED) or a vertical cavity surface emitting laser (VCSEL) and, in particular, to the use of such a material in the encapsulation of such a light-emitting device, in order to serve as a protective and/or transmissive layer, and/or a means by which the light from such devices may be optically tuned. The invention also relates to a process for producing such a SOG material and to the use of such a SOG material in wafer bonding applications whereby two or more wafers are bonded together.

BACKGROUND OF THE INVENTION

A vital and growing use of energy is in the generation of electricity. In the United States alone, the financial cost of producing electricity is in excess of $60 billion a year; however, the cost of electrical energy should not be measured in dollars alone. When identifying the total cost of electricity, the environmental cost of smog and carbon dioxide pollution associated with electricity production from fossil fuel must be considered. Currently, approximately 20 percent of the electricity produced in the United States is used for lighting.

The most widely used sources of artificial illumination (defined as a source other that the sun), to date, are incandescent and fluorescent lamps. In the near future, however, solid-state lighting (SSL) devices promise to replace conventional light sources. SSL devices: 1) are energy efficient, 2) produce little pollution, 3) are vibration and shock resistant, and 4) are exceptionally long lived. These devices will allow a wide variety of lighting, including artificial lighting that is very similar to natural daylight and, with appropriate circuitry, the color and intensity of the lighting can be controlled. SSL devices also offer more flexible design possibilities. They can be manufactured as flat packages of any shape and can be placed on floors, walls, ceilings, etc. In the United States, through the use of SSLs, the total cost of lighting would be reduced by about $100 billion and pollution would be reduced by over 100 million metric tons between now and the year 2020. By the year 2020, electricity used annually for lighting could be cut by about 50%, sparing the atmosphere 28 million metric tons of carbon emissions annually. As an example of the benefits of SSLs: a typical 12-inch-diameter red traffic signal using a long-life 140 Watt (W) incandescent lamp generates a white flux of nearly 2000 lumens (lm). The red filter that covers the white lamp transmits only about 200 lm of the original intensity. The corresponding LED solution uses LED lamps to produce greater than 200 lm of red light, while consuming a total of only 14 W, including the losses in the power conversion circuit.

SSL sources can be made with either inorganic or organic semiconductors. An example of such an SSL device that uses an inorganic semiconductor material is an LED. The essential elements of this device are an electron-carrying N-layer and a hole-carrying P-layer. When a forward voltage is applied to the structure (negative to the N-layer and positive to the P-layer), electrons are ejected from the N-layer and the holes in the P-layer. Electrons and holes can radiatively recombine, thereby emitting a photon. The wavelength and color of the photon is determined by the difference in the energy levels between the electrons and the holes, which is determined by the properties of the material utilized to fabricate the structure.

Many approaches exist for generating white light using solid state devices, e.g., a multi-chip LED, a blue LED plus yellow phosphor, a blue LED plus green and red phosphors, and a UV-LED plus red, green, and blue phosphors. Conventional inorganic phosphors and group II-VI semiconductor nano-crystals at an excitation wavelength between 370 nanometers (nm) and 460 nm can also be used to generate white light.

Another way to generate SSL white light is to efficiently mix the output of devices providing red, green, and blue light. An SSL device and a phosphor together can also generate white light. For instance, when a blue emitting SSL device shines on a yellow-emitting phosphor, the resulting light appears white to the human eye. However, in this case the color rendering is usually poor. This problem can be overcome by using the light from a UV-emitting device to excite an appropriate color combination of phosphor, to produce white light.

Currently, the LED industry normally uses organic polymeric materials to encapsulate LEDs. These encapsulants include epoxy resins, polycarbonates, siloxane polymers, and dealcoholyzed sol-gels. These encapsulants can also be used as a binder for a Cerium (Ce) and activated Gadolinium (Gd) doped YAG (Yttrium Aluminum Garnet) phosphor, and any other dopant activated to generate white light. This material is typically referred to as Ce:YAG phosphor. The white light emission results from blue LED pumping (typically around 450 nanometers [nm] LED emission) to generate white light appearance. Most of the organic polymers are overly sensitive to UV light and start to degrade after certain periods of exposure. Upon this degradation, yellow to brown color starts to develop in the encapsulant, which has a significant impact on the white light emission because of the absorption of the new species generated in the degraded polymers. The extent of discoloration is dependent upon the UV light wavelength, the UV stability characteristics of the encapsulant material and the UV light exposure time.

Using such unstable materials for LED encapsulant applications has two detrimental consequences. The lifetime of such a device will be undesirably short and, therefore, maintenance costs will be very high. Materials for LED encapsulation should have specific characteristics. The characteristics needed for a good LED encapsulant material are known to those skilled in the art, and include: UV stability, heat stability, and hydrolytic stability of materials designed for such applications. Encapsulant materials for LED applications should tolerate low temperature (about −40° C.) and high temperature (from about 85° C. to 150° C.), and cycling to mimic real life performance in different seasons or different environmental conditions. Cracking can be a major issue in encapsulation of, for example, a phosphor for LED applications because encapsulant cracking can cause wires on an LED to debond.

LED manufacturers currently are using epoxy resins or siloxane materials in such encapsulant applications. The epoxy resins now in use are organic polymeric materials and they have a tendency to yellow upon exposure to UV light. The siloxane materials used are transparent to UV light and can resist the UV light exposure from the LED. However, these siloxane materials are normally very soft and can be damaged very easily during manufacturing, shipping and/or application. In addition, these siloxane materials cannot protect moisture sensitive dopants. A non-hydrolytic sol-gel spin-on glass material can be a good alternative for both of these systems The prior art reveals there is a need for improving material characteristics for LED encapsulation applications. The major focus of these prior art patents involves using an epoxy or siloxane material as an encapsulant in such LED applications.

U.S. Pat. No. 6,204,523 describes a method for encapsulating a phosphor in an LED using a silicone material. The LED can emit light of wavelength green (570 nm) to near UV (350 nm) wavelength range. This patent claims that the silicon material does not yellow upon extended exposure to UV light. It is also disclosed it is then necessary to use a resilient soft core in the vicinity of the LED chip to prevent damage caused by mechanical stress to the LED chip or its wire leads. A harder shell is also utilized on the exterior to provide better protection and integrity to the LED. Different dopants can be used in these encapsulant materials. The silicone coated LED substantially maintains its light transmission when exposed to a temperature between 85 degrees Celsius (° C.) and 100° C. and a relative humidity of 85%.

The published prior art documents the use of a sol-gel material resulting from the de-alcoholation of an alkoxy silane. The process temperature is between 80° C. and 150° C. The fluorescent material is admixed with a solution of this sol-gel material, which is then applied and heated to produce a glass-like body. Two different dopants were also used with the sol-gel material. These dopants have compositions of $SeSEu^{2+}$, which emits red fluorescent light, and $(Sr, Ba, Ca)S:Eu^{+2}$, which emits green fluorescent light. The light-emitting device has a glass-like layer containing said fluorescent materials with a thickness of 100 microns (micrometers) or less.

U.S. Pat. No. 6,351,069B1 describes the use of an epoxy resin paste as a binder (encapsulant) for an LED. A Ce-YAG phosphor is coated onto a gallium nitride (GaN) LED to generate white light from a 470 nm LED. The secondary light from the supplementary fluorescent material allows the device to produce "white" output light that is well balanced with respect to color, for true color rendering applications. The die is preferably a GaN based die that emits light having a peak wavelength of 470 nm. The fluorescent layer also includes a primary fluorescent material in an epoxy resin. Such epoxy materials are sensitive to UV light and suffer from the drawback that their optical transmissive characteristics degrade over time because of yellowing. As a result of such degradation, some of the light produced is absorbed by the encapsulant.

U.S. Patent application number US 2002/0093287A1 describes the addition of an extra diffusion layer onto the yellow fluorescent powder on a blue light LED chip. This diffusion layer, which contains micro-particles such as glass powder or transparent plastics such PMMA, PET, PC and PE, diffuses and refracts the light and makes it more uniform.

U.S. Patent application number US 2002/0084749 A1 describes a multi-layer coating for an LED, which layer contains a silicone encapsulant, a phosphor, a reflecting layer and a layer encapsulant. It is claimed that the reflecting layer reflects the unconverted UV light back into the phosphor layer where it is converted to visible light, resulting in increased output from the light source.

U.S. Pat. Nos. 6,069,440 and 5,998,925 disclose achieving white light conversion by using a phosphor suspended in an epoxy resin as an encapsulant coated on top of the LED. The phosphor consists of yttrium (Y), lutetium (Lu), scandium (Sc), lanthanum (La), gadolinium (Gd), and samarium (Sm) and at least one element selected from the group consisting of aluminum (Al), gallium (Ga), and indium (In).

U.S. patent application number 2001/0030326A1, U.S. Pat. No. 6,245,259B1, U.S. Pat. No. 6,066,861 and U.S. Pat. No. 6,277,301B1 all disclose a method that uses a dopant containing a resin such as an epoxy resin to encapsulate an LED. The semiconductor body emits radiation in the ultraviolet, blue and/or green spectral region and luminescence such as $A_3B_5X_{12}:M$ (A=Y, Ga, boron [B], Al, Ga, and M=europium [Eu], chromium [Cr]), e.g., YAG:Ce as a conversation element that converts a portion of the radiation into radiation of longer wavelength. This makes it possible to produce an LED that radiate polychromic light, in particular white light.

U.S. patent application number 2002/0084745A1 claims that an LED comprising a light emitting component and a dielectric phosphor powder that absorbs emitted light from the light-emitting source and reemits light of a different wavelength. The dielectric phosphor powder consists of a mixture of phosphor particles and microscopic, spherical dielectric particles with a band gap energy larger than 3 electron volts (eV). Phosphor particles and bubbles or voids can also be used instead of dielectric particles.

U.S. Pat. No. 6,274,924B1 describes an LED package that includes a heat-sinking slug that is inserted into an innermolded lead frame. This design includes a reflector cup with a thermally conducting sub-mount. Wire bonds extend from the LED to the metal leads. The metal leads are electrically and thermally isolated from the slug. An optical lens may be added by mounting a pre-molded thermoplastic lens and a soft encapsulant or by casting an epoxy resin to cover the LED. The hardness of the epoxy resin is 50-90 Shore D. The encapsulant used was a soft optical silicone material with a 10 Shore A hardness, which fills the area between the LED die and the optical lens and also protects the LED die.

U.S. Pat. No. 5,145,889 relates to a design for an LED chip wherein lead frames are connected to an anode and a cathode of the LED chip. An encapsulant is used to encapsulate both the light emitting device and the lead frames. A buffer layer is formed between the encapsulant and the LED to reduce the stress from the encapsulant onto the LED chip. The encapsulant is an epoxy composition that includes an epoxy resin, a curing agent, a curing accelerator and a triorganothiophosphite.

U.S. Pat. No. 6,407,411B1 claims an LED packaging that includes a thermally conducting, electrically insulating material that enhances the thermal conductivity and structural integrity of the assembly, a UV-resistant encapsulant material, and an integral electrostatic discharge material. The thermally conducting, electrically insulating material creates an electrically insulated, thermally conductive path in the lead frame assembly for the dissipation of power and also acts as a mounting structure, thereby allowing the use of a soft encapsulant material, preferably a silicone material.

EP 1,248,304A2 discloses using a phosphor in different encapsulants such as an epoxide, an acrylic polymer, a polycarbonate, a silicone polymer, an optical glass or a chalcogenide glass, for light conversion. They used 5% to 35% of a dopant in these encapsulants. Recommended were various methods of coating the encapsulant including spraying, screen printing, electrophoresis, and dipping in a slurry solution.

U.S. Pat. No. 5,959,316 describes encapsulating an LED device with a UV curable epoxy resin. The inventor uses a UV curable material because the normal drop in viscosity during the heat cure would allow most resins, especially an epoxy resin, to flow away from the LED header despite the small size of the drop utilized.

Manufacturers are currently using a number of epoxy materials for wafer bonding applications. These epoxy materials are not ultraviolet (UV) light stable and normally degrade during 5 hours exposure to 365 nanometer (nm) UV light at 45-84 milli-watts (mW)/cm², which results in yellowing and drastic reduction of light transmission. The critical elements of the prior art wafer bonding processes normally involve bonding a clear glass to a fully fabricated wafer using a UV curable epoxy. The silicone side of this glass-epoxy-silicon sandwich is then thinned down to an isolation moat that allows the formation of a P and N back ohmic contact.

The subject invention provides a number of advantages over current materials useful for LED encapsulation or wafer bonding. Such advantages include: (1) improved UV stability of these sol-gel spin-on glass materials over prior art organic polymers; (2) superior thermal and hydrolytic stability over currently used organic materials; (3) improved cracking and yellowing characteristics at −40° C. to 150° C., (4) the capability to host different organic and inorganic dopants for optical and electrical applications; (5) inherently flame retardancy, which means they can be used in various applications, such as in the aerospace industry; (6) a refractive index can be easily tuned by minor changes in the chemistry of the material; (7) the ability to function as a good host for different dopants, especially moisture sensitive and nano crystal materials; (8) good hydrophobicity of these materials enhances their hydrolytic stability; (9) various sol-gel moieties can be introduced into these material systems to lower oxygen and moisture permeability and block any UV irradiation from an LED, for safety purposes; (10) depending on the application, a wide range of different film thicknesses (e.g., 1-100 microns) can be applied; (11) these materials can be UV curable, making them useful for printing different structures on top of electronic and/or optoelectronic wafers.

SUMMARY OF THE INVENTION

A new sol-gel spin-on glass (SOG) material is provided that may be utilized, for example, in the encapsulation of a light-emitting device or in wafer bonding. The new sol-gel spin-on glass (SOG) material is a hybrid glass/polymer material having such beneficial properties as good light transmittance, thermal stability, ultra-violet illumination stability, hydrolytic stability, and temperature shock resistance. The subject SOG material is selected from the group having the following structural formulas:

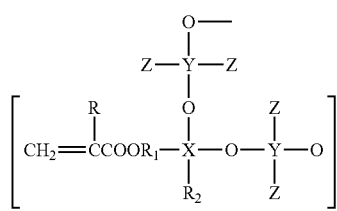

Formula I

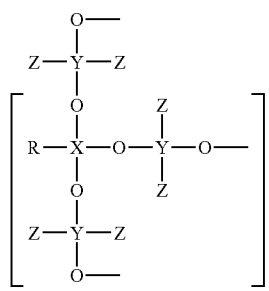

Formula II

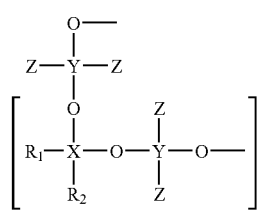

Formula III

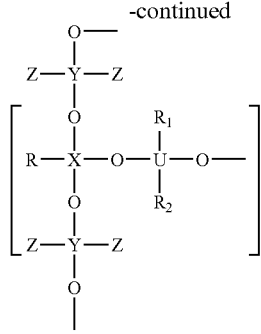

Formula IV

Wherein in Formula I:
R=Hydrogen, $C_1$ to $C_8$ Alkyl, Halogenated $C_1$ to $C_8$ Alkyl, or Glycidyloxyalkyl
$R_1$=Ethyl, propyl, another $C_1$ to $C_8$ Alkyl, Halogenated $C_1$ to $C_8$ Alkyl, Phenyl and Halogenated Phenyl
$R_2$=Methyl, Ethyl or another $C_1$ to $C_8$ Alkyl
X, U, Y=Si, Ge, Ti or Sn
Z=Alkyl, Substituted Alkyl, Phenyl, Substituted phenyl
Wherein in Formulas II, III and IV:
R=Methacryloxyalkyl, Acryloxylalkyl, Glycidyloxalkyl
$R_1$=Phenyl or Substituted Phenyl; Ethyl, Propyl or another $C_1$ to $C_8$ Alkyl; or Trifluoroalkyl such as Trifluoropropyl
$R_2$=Methyl, Ethyl or another $C_1$ to $C_8$ Alkyl
X, U, Y=Si, Ge, Ti or Sn
Z=Alkyl, Phenyl, substituted Phenyl The subject SOG material is preferably produced in a non-aqueous media and may be heat cured or UV light cured, depending upon the exact structure of the material. The SOG material of the present invention is preferably produced from an alkyl substituted trialkoxysilane or dialkyl substituted dialkoxysilane, wherein the alkyl group has 1 to 8 methyl groups, represented by the formula:

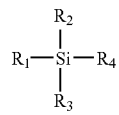

Wherein in the formula:
$R_1$ = Hydrogen, $C_1$ to $C_8$ Alkyl, Halogenated $C_1$ to $C_8$ Alkyl, Methacryloxyalkyl, Acryloxyalkyl, or Glycidyloxyalkyl;
$R_2$ = Ethyl, Propyl, Another $C_1$ to $C_8$ Alkyl, Halogenated $C_1$ to $C_8$ Alkyl, Phenyl, Substituted Phenyl such as Halogenated Phenyl, Trifluoroalkyl such as Trofluoropropyl;
$R_3$ = Methyl, Ethyl, Another $C_1$ to $C_8$ Alkyl;
$R_4$ = Methoxy, Ethoxy, Propoxy, Butoxy, or another Alkoxy.

Wherein in the formula:
$R_1$=Hydrogen, $C_1$ to $C_8$ Alkyl, Halogenated $C_1$ to $C_8$ Alkyl, Methacryloxyalkyl, Acryloxyalkyl or Glycidyloxyalkyl;
$R_2$=Ethyl, Propyl, Another $C_1$ to $C_8$ Alkyl, Halogenated $C_1$ to $C_8$ Alkyl, Phenyl, Substituted Phenyl such as Halogenated Phenyl, Trifluoroalkyl such as Trofluoropropyl;
$R_3$=Methyl, Ethyl, Another $C_1$ to $C_8$ Alkyl;
$R_4$=Methoxy, Ethoxy, Propoxy, Butoxy, or another Alkoxy.

The alkyl group may, Car example, be replaced with a methacyloxypropyl, acryloxypropyl, or epoxy moiety, which improves the suitability of this SOG material for UV printing and patternability. This provides a preferred SOG material with a higher degree of flexibility and improved patterning when using UV illumination. Reducing the number of alkoxy groups from 3 to 2 also reduces the cross-link density of the present SOG material and also improves its material flexibility, which allows this material to further tolerate the stress cause by extreme cold, heat, or mechanical shock.

A process is provided for producing the subject sol-gel spin-on glass (SOG) material of the present invention by: reacting an alkyl substituted trialkoxysilane or a dialkyl substituted dialkoxysilane with a silane diol, wherein said alkyl group has from 1 to 8 carbon atoms. The silane diol is preferably a diphenylsilanediol, a 1,3-Bis (3-hydroxypropyl) tetramethyldisiloxane, a 1,3-Bis (4-hydroxybutyl) tetramethyldisiloxane, a fluorinated silane diol, or a mixture of one or more of these silane diols. The alkyl group may be replaced with a methacyloxypropyl, acryloxypropyl, or epoxy moiety. The trialkoxysilane may have one or two $C_1$ to $C_8$ alkyl, methacryloxypropyl and/or alkoxy groups on the same molecule and the dialkoxysilane may have one or more (preferably 1 to 3) $C_1$ to $C_8$ alkyl, methacryloxypropyl and/or alkoxy groups on the same molecule. The process may further comprise adding an inorganic or organic dopant, wherein the dopant preferably comprises a phosphor dopant (such as a YAG base phosphor or a moisture sensitive phosphor) nanoparticles, or an organic material such as an organic dye or a metal complex.

A process is also provided for patterning the non-aqueous sol-gel spin-on glass (SOG) material of the present invention by: a) coating a substrate with the spin-on glass material; b) exposing the coated substrate of step a) to UV illumination in a desired pattern; c) post-exposure baking the coated substrate of step b) at a temperature from 100° C. to 120° C. for 30 to 60 minutes; d) cooling the coated substrate of step c) to room temperature; e) removing the non-exposed areas of the coating on the coated substrate of step d); f) drying the coated substrate of step e); g) hard baking the coated substrate of step f) at a temperature from 120° C. and 150° C. for 1 to 3 hours.

The process may further comprise adding a UV light blocking material and/or an oxygen scavenger, a light-scattering material, or a coupling agent, wherein the coupling agent is preferably a dibutoxyaluminoxytriethoxysilane, a mixture of zirconium isopropoxide and methacrylic acid, or another transition metal propoxide. The process may also comprise the reaction of an alkoxy silane with an organic diol in a non-aqueous medium in the presence of a catalyst, wherein the catalyst is preferably a tin catalyst (such as dibutyltin diluarate), titanium isopropoxide, acetic acid or trifluroroacetic acid. The process may further comprising adding a coupling agent, wherein the coupling agent is preferably a dibutoxyaluminoxytriethoxysilane, a mixture of zirconium isopropoxide and methacrylic acid, or another transition metal propoxide.

BRIEF DESCRIPTION OF THE DRAWINGS AND TABLES

Figure 1:
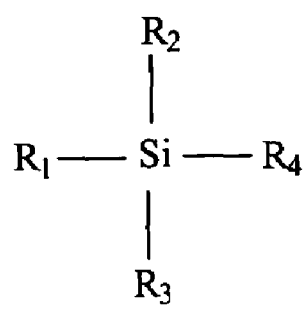
FIG. 1 illustrates the structure of a silane molecule of the present invention with different related substituents such as a mono-alkyl, dialkyl, allyl, acryloxypropyl, methacryloxypropyl, or an epoxy group.

Table 1 shows the viscosity and GPC characteristics of SOG material precursors of the present invention made from different starting materials at different reaction times and viscosities.

Table 2 shows the solvent resistance of a fully cured SOG material of the present invention to different solvents such as methanol, ethanol, isopropyl alcohol, methylethylketone, n-propylacetate, and tetrahydrofuran.

Table 3 shows that the refractive indices of SOG materials of the present invention at 1550 nm, indicating the ability to tune the index of refraction of the SOG materials for specific applications. This table also shows the wavelength at which these material begins to exhibit UV absorption, indicating the UV stability of these SOG materials.

Table 4 shows the transmittance of a SOG material-coated borosilicate glass wafer after 25 hours exposure to 365 nm UV light at a power density of 45 milliwatts per square centimeter.

Table 5 shows the hardness and effect of temperature cycling in an environmental chamber on the cracking of cured SOG materials of the present invention, at different temperature cycling conditions.

Table 6 shows the effect on cracking of coupling agent content of a cured SOG material coated on the glass slide at −40° C. to 100° C., −40° C. to 125° C., and −40° C. to 150° C. temperature cycled for 16 cycles at each condition.

Table 7 shows the cracking characteristics of fluorinated and non-fluorinated of cured SOG materials coated on the glass slide at −40° C. to 100° C., −40° C. to 125° C., and −40° C. to 150° C. temperature cycled for 16 cycles at each condition.

Table 8 shows a comparison of the cracking of cured SOG material drops on glass slides prepared using a SOG material with a coupling agent pre-added during reaction or post added to the reaction before coating.

Table 9 shows the glass transition temperature and decomposition temperature of the SOG materials of the present invention.

DETAILED DESCRIPTION OF THE INVENTION

All embodiments of the present invention utilize a hybrid glass/polymer sol-gel material, which is herein designated as a sol-gel spin-on-glass (SOG) material. Materials useful for optoelectronic encapsulation or wafer bonding require specific characteristics that include thermal, hydrolytic, and UV stability, as well as resistance to heat, cold and mechanical stress. Lack these characteristics frequently leads to the cracking and delamination of the material from the substrate. Industry is currently using either epoxy or polysiloxane blended dye for LED encapsulation and wafer bonding applications. These epoxy materials are not UV stable and tend to become yellow with time when exposed to UV illumination, which causes absorption and reduces the amount of emitted light. Epoxy materials normally have glass transition temperatures of approximately 120° C., and therefore cannot withstand low temperature shock. Polydimethylsiloxane materials show good UV resistance and good thermal stability. Polysiloxanes are soft elastomeric materials with low glass transition. However, these materials are soft and, therefore, they are susceptible to scratching during manufacturing and handling. These siloxane materials are also moisture and oxygen permeable and are not a suitable encapsulant for moisture and oxygen sensitive materials. In addition, these materials cannot tolerate the mechanical stress related to long-term service. Classic sol-gel materials are very rigid and fabricating a film with a thickness of greater than 100 micrometers (microns or μm) is not feasible because of the cracking that often results from mechanical stress. In the present invention, a hybrid sol-gel SOG material with good rigidity, thermal stability, good organic/inorganic dye miscibility, and good heat/cold shock resistance was developed. This SOG material was produced from the reaction of an alkoxy silane with an organic diol in a non-aqueous medium in the presence of a catalyst, preferably a tin catalyst such as dibutyltin diluarate, titanium isopropoxide, or an acid such as acetic acid or trifluroroacetic acid. Table 1 shows SOG material precursors of the subject invention made from different starting materials at different reaction times and viscosities.

Figure 2:
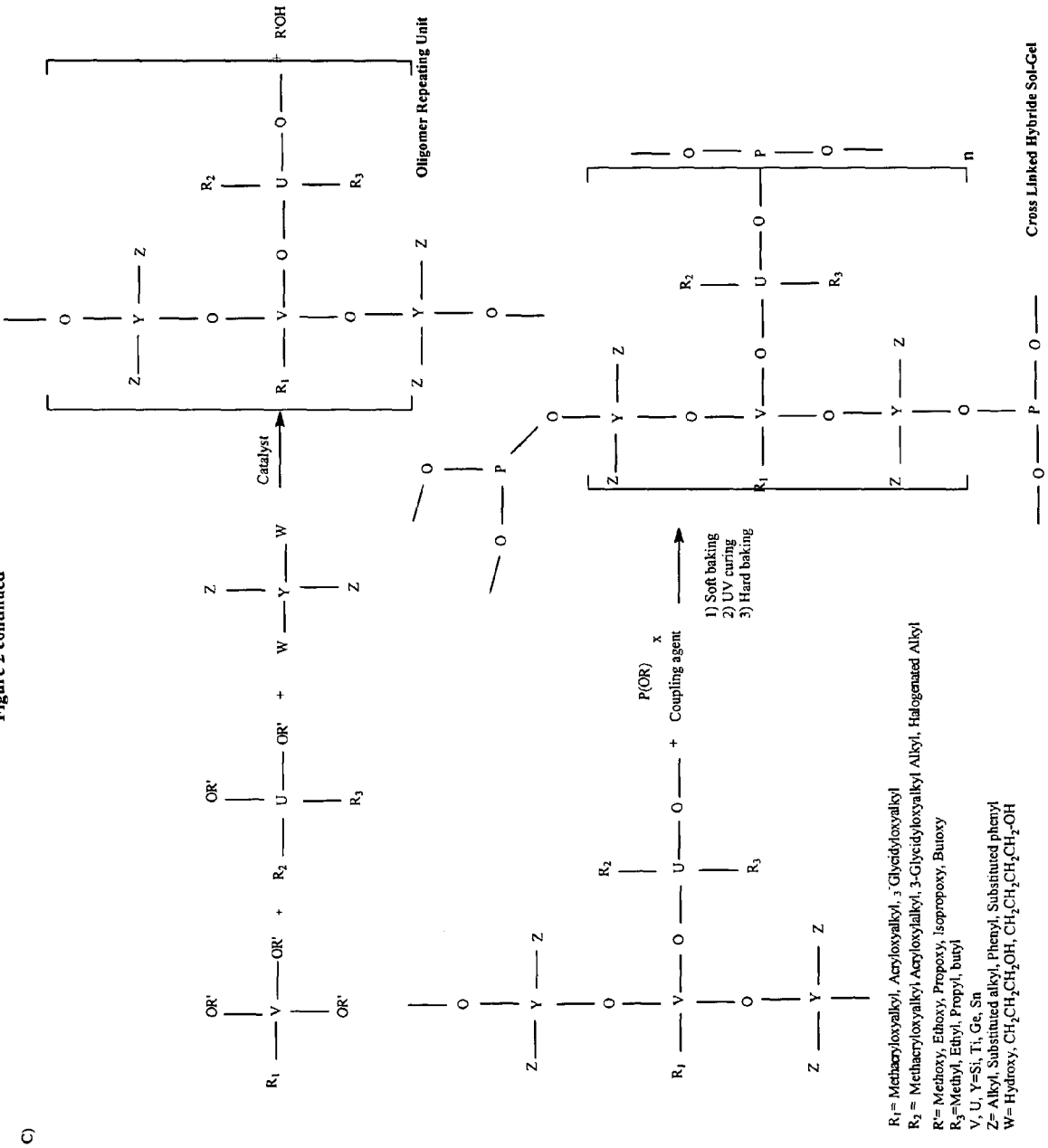
FIG. 2 illustrates the chemical structures of a preferred UV light-curable SOG material of the present invention.

The silane molecule may carry mono-alkyl, dialkyl, allyl, acryloxypropyl, and/or methacryloxypropyl groups, as illustrated in FIG. 1. The size of the alkyl group impacts the rigidity of the spin-on glass material. Insertion of a methacryloxypropyl, or acryloxypropyl group into the SOG material structure imparts good patternability to the SOG material, e.g., at a wavelength of 365 nanometers (nm) or 254 nm, as illustrated in FIG. 2.

Figure 3:
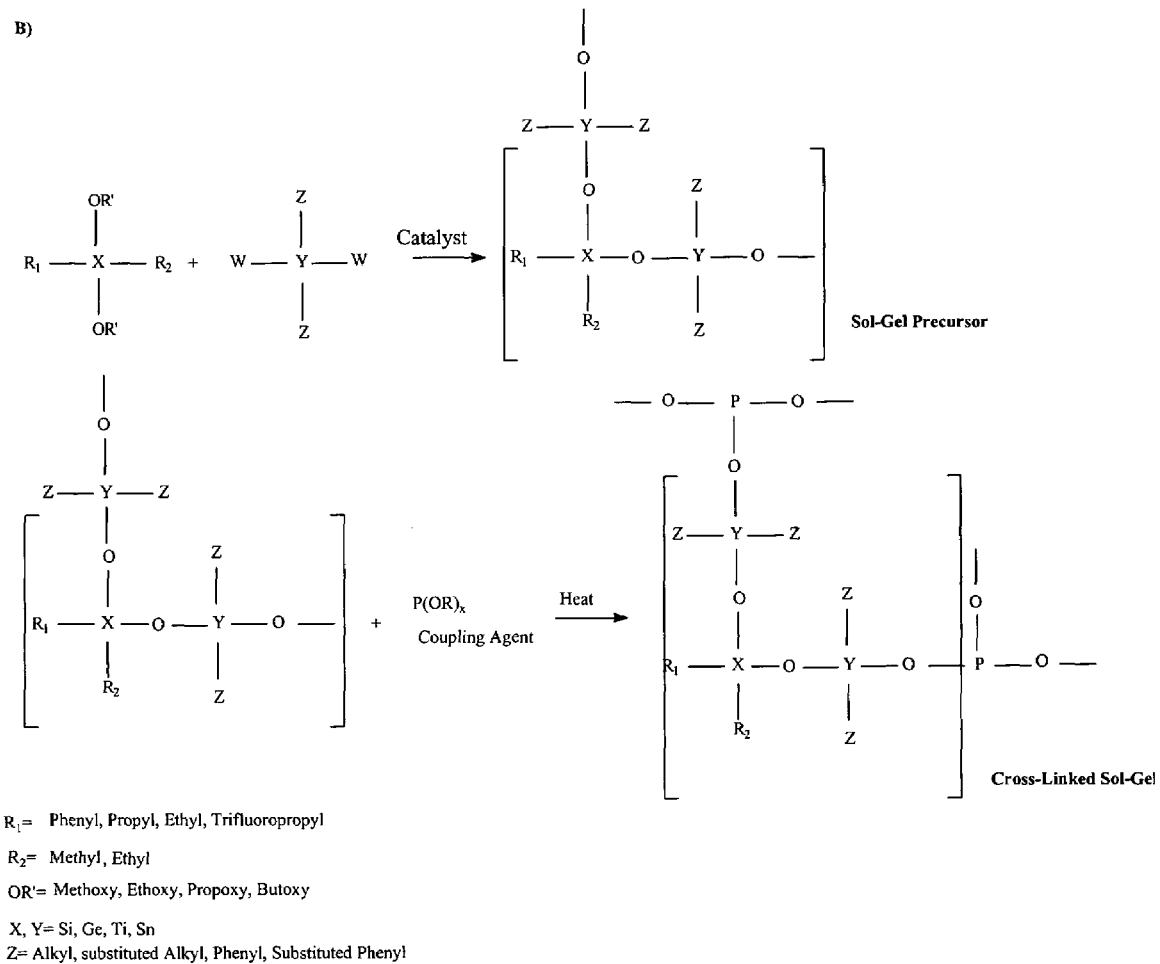
FIG. 3 illustrates the chemical structures of a preferred heat-curable SOG material of the present invention.
Figure 3:
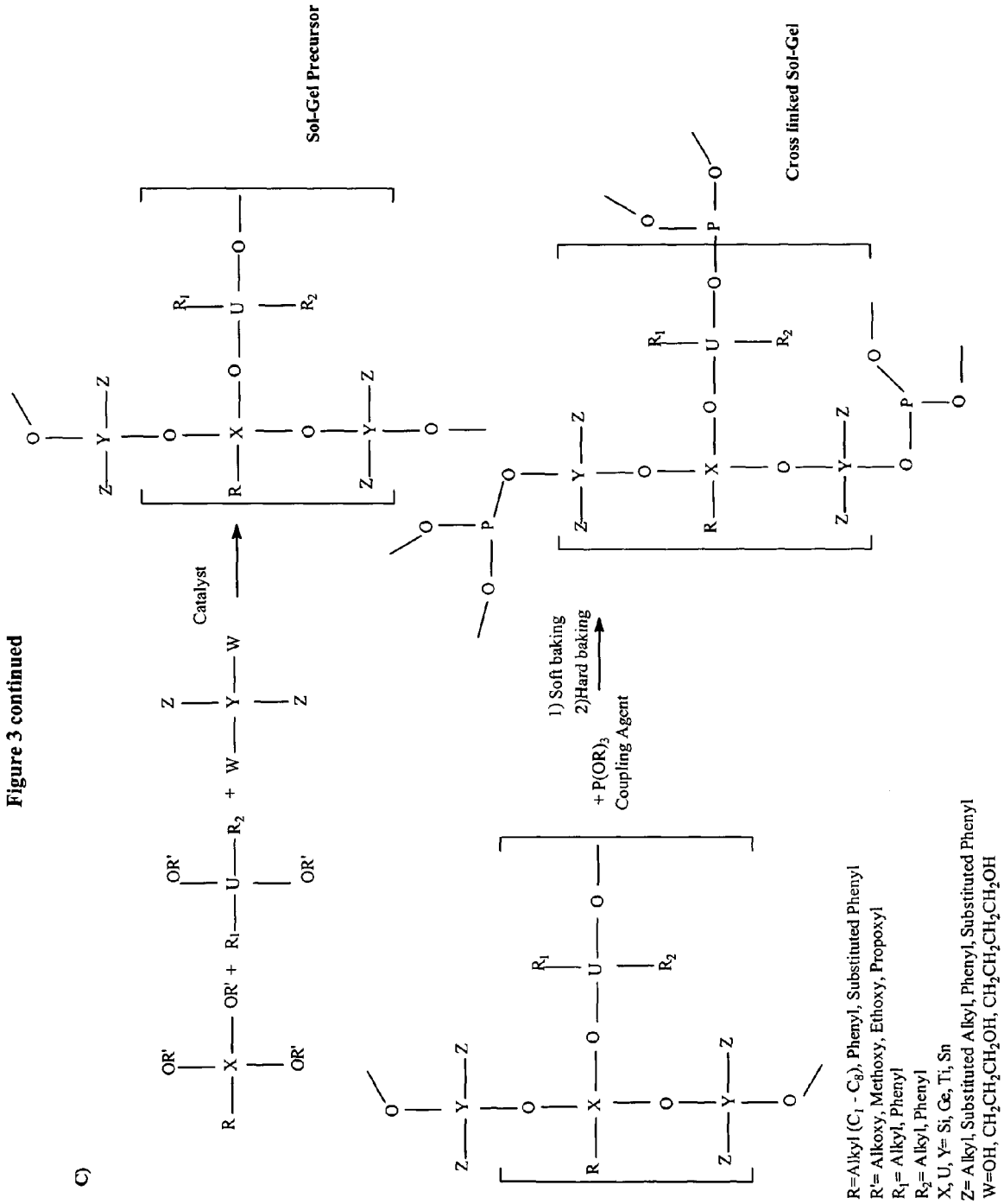
Figure 3:
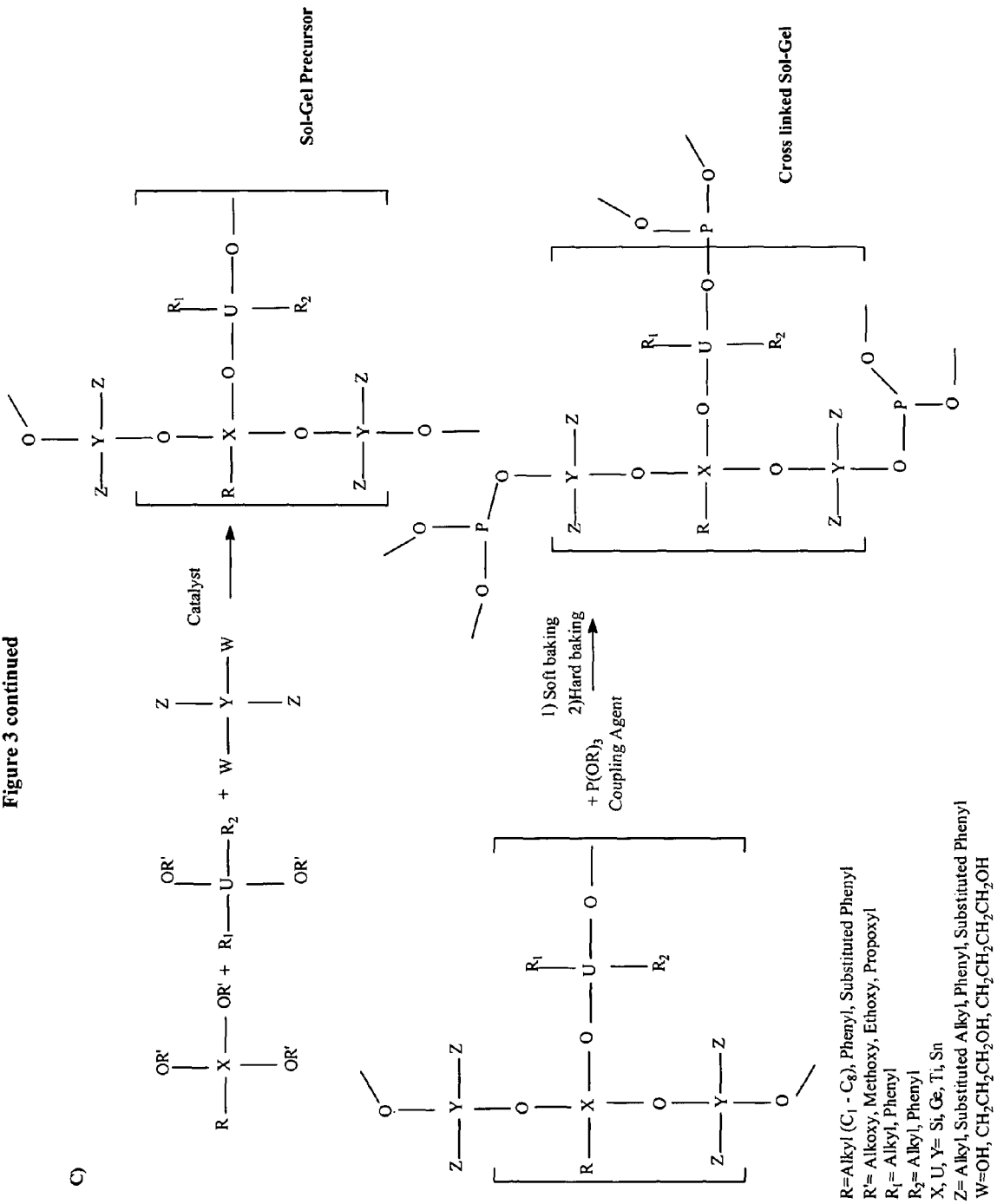

Introducing more than one alky group or one alkyl group and a methacryloxypropyl group into the structure of the precursor of the SOG material of the present invention affects the softness and glass transition of the material because the cross-link density of such a SOG material is lower than that of a material prepared from a trialkoxysilane with an alkyl group or a methacryloxypropyl group. By selecting the proper structure for the SOG material precursor, the desired characteristics such as degree of rigidity and patternability, and the desired glass transition temperature, can be introduced into the particular SOG material of the subject invention, as shown in FIG. 3.

Figure 4:
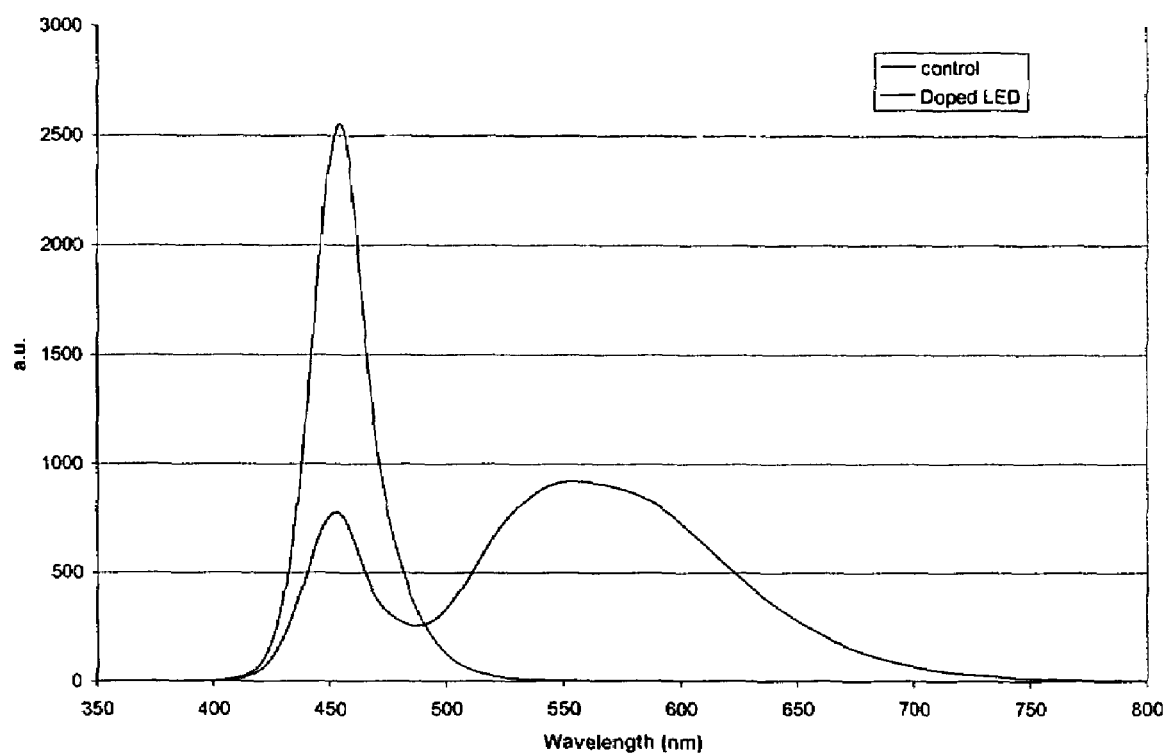
FIG. 4 shows the emission spectra of phosphors that are distributed within the SOG material of the present invention, in an encapsulated LED.

The SOG material of the present invention may also be a good host material for different species, such as a Ce:YAG phosphor. Different phosphors, including moisture sensitive phosphors such as calcium sulfide:europium, zinc cadmium sulfide:silver, and yttrium gadolinium aluminum oxide:cerium were blended into SOG materials of the subject invention and an LED die-on-header was encapsulated with drops of one of these different SOG materials. These drops were then heat cured. FIG. 4 shows the emission spectra of these phosphors distributed within the SOG materials of the present invention in the encapsulated LEDs.

EXAMPLES

Equivalent moles of an alkoxy silane and of a substituted silane diol were mixed at room temperature, and 1% titanium isopropoxide catalyst was added into the reaction solution while the reaction mixture was being mixed. The temperature of an oil bath enclosing the reaction vessel was adjusted to 115° C.-120° C. while the reaction mixture was purged under nitrogen. The completion of this reaction was monitored by viscosity measurement. The by-product, which is a mixture of alcohols, was then removed under reduced pressure. The viscosity of the material may be lowered to the desired viscosity for different desired film thicknesses or applications using a suitable solvent such as methylethylketone, methanol, or n-propyl acetate.

The viscosity of the resulting material was measured using a Brookfield™ viscometer with a micro-head attachment and Gel Permeation Chromatography (GPC) was used to measure the molecular weight of the materials, the results of which are tabulated in Table 1 below. GPC results included weight average molecular weight, number average molecular weight, and polydispersity. Different coupling agents such as dibutoxyaluminoxytriethoxysilane, a mixture of zirconium isopropoxide and methacrylic acid, or other transition metal propoxide at different levels can be formulated into these SOG materials. These coupling agents can have a significant effect on the adhesion of these materials to a substrate such as glass, silicon, sapphire or various metal substrates. However, these coupling agents may negatively impact the curing time and rigidity of the resulting SOG material. Depending on the structure of the SOG material precursor, these materials can either be heat cured or UV and heat cured. The SOG material can then be coated onto different substrates such as glass, quartz, sapphire, silicon, a metalized substrate or a polymeric film using different coating methods, such as spin coating, dip coating, spray coating and doctor blade coating. The coated SOG material of the present invention on the substrate is then preferably soft baked at 100° C.-120° C., more preferably at about 110° C. for about 1 hour (hr); and preferably again soft baked at 100° C.-130° C., more preferably at about 120° C. for 2 hrs; and then preferably hard baked at 140° C.-160° C., more preferably at about 150° C. for about 3 hrs. For UV curing, the coated sol-gel SOG material is preferably soft baked at 100° C.-120° C., more preferably at about 1110° C. for about 1 hr; and preferably again soft baked at 100° C.-130° C., more preferably at about 120° C. for about 2 hrs.

The primary purpose of soft baking of the SOG material is to substantially reduce or eliminate material stickiness by removing solvent. In this soft baking process, the solvent is substantially all evaporated from the material and the molecular weight of the silicone part of the material somewhat increases. Monitoring the soft and hard bake heating temperature and heating time can be very crucial, because the SOG materials may further cure at a higher temperature or an extended baking time. The UV curing of the SOG material can be conducted at 365 nm or 254 nm, using an appropriate curing initiator. For 365 nm UV exposure, Lucerin™ OT or another initiator sensitive to 365 nm can be used. Initiators sensitive to deep UV illumination such as Irgacure™ 284 and Irgacure™ 819, dimethylbenzin, benzoylbiphenyl, at 1-10% concentration can be used for 254 nm curing.

Desired patterning of the SOG material of the present invention, which can function like a negative photoresist, may be printed using well-known contact or proximity lithography methods. For example, the SOG material coated substrate may be exposed to UV illumination in a desired pattern, at the preferred wavelength, to thereby cure the SOG material coating in the exposed areas. The exposed coated SOG material is then preferably post-exposure baked at 100° C.-120° C. for 30-60 minutes. After the coated SOG material is cooled to room temperature, the non-exposed areas of the coated SOG material may then be removed, such as by developing in a suitable organic solvent, e.g., tetrahydrofuran, methylethylketone, or n-propylacetate. The remaining SOG material pattern may then be dried by flushing with a non-reactive gas such as nitrogen and then hard baked at between 120° C. and 150° C. for between 1 and 3 hrs, respectively, depending on the thickness of the patterned SOG material.

The fully cured SOG material of the present invention is resistant to many different solvents such as methanol, ethanol, isopropyl alcohol, methylethylketone, n-propylacetate, and tetrahydrofuran. A spin-coated SOG material of the subject invention consisting of the subject SOG material that has been fully cured by UV curing and heating at 110° C. and 150° C. for 1 hr and 3 hrs, respectively, was immersed in different solvents for 10 minutes. The coating thickness was measured before and after exposure to the respective solvent.

Results are tabulated in Table 2 below. No substantial change in thickness was observed after exposure to the solvents.

SOG materials made by reacting methacryloxypropyltrimethoxysilane with diphenylsilanediol (MAPTMS) or methacryloxymethyldimethoxysilane with diphenylsilanediol (MAPMDMS) were formulated with 5% and 10% dibutoxyaluminoxytriethoysilane, respectively. The SOG materials were then cast on glass slides and cured. Dynamic mechanical analysis was used to measure the coefficient of thermal expansion using TA Instrument TMA Q400. The glass substrate was used as the base line. The results were as follows:

| Material | Temperature range ° C. | CTE, ppm/° C. |
|---|---|---|
| MAPTMS | 50–193 | 16.0 |
| MAPMDMS | 112–197 | 58.1 |

In another experiment SOG material made by reacting methacyloxypropyltrimethoxysilane with diphenylsilanediol was formulated with 10% dibutoxyaluminoxytriethoxysilane (MAPTMS). The resulting SOG material was then coated onto a 500 μm thick poly(ethyleneterephthalate) (PET) film. The coated PET soft baked at 110° C. and 120° C. for 1 and 2.5 hrs and then UV exposed to UV light for ten seconds. The film then was hard baked at 150° C. for 3 hrs. Oxygen and moisture permeability of this SOG material were then measured. The condition for measuring oxygen permeability was a temperature of 23° C., 760 mm Hg Oxygen on one side and 760 mm Hg Nitrogen on the other side, with zero relative humidity. The testing condition for moisture permeability was 40° C. with a relative humidity of 75% on one side and zero relative humidity on the other side. The results are summarized as follows:

| Sample | Oxygen permeability CC · mil/100 in$^2$ · day · day | Moisture permeability gm · mil/100 in$^2$ · day |
|---|---|---|
| PET | 0.9655 | 0.293 |
| MAPTMS | 0.293 | 0.256 |

The refractive indices of the SOG materials were measured using a prism coupler at 1550 nm. These materials have refractive indices in the range of 1.5056 to 1.5630, as shown in Table 3 below. SOG materials of the present invention with different refractive indices may be preferentially designed for different applications, such as a material with a refractive index match for optoelectronic applications. Also tabulated in Table 3, UV-visible spectrophotometry was used to measure the UV absorption of the subject SOG materials. The results indicate that these materials do not have UV absorption up to 285 nm, demonstrating that these SOG materials have very good UV stability. For example, a curable SOG material at 254 nm showed only 1% transmittance loss after exposure to 365 nm UV illumination at a power density of 45 milliwatts per square centimeter (mW/cm$^2$). Transmittance results are shown in Table 4 below. This is a very important property for a good encapsulant for an LED working in the UV range 385-410 nm.

These SOG materials have different hardnesses, as shown in Table 5 below. Materials useful for LED applications must also meet environmental test requirements as demanded by the industry, wherein the encapsulant material is tested for cracking. Cracking characteristics of the SOG materials of the present invention were measured using an environmental chamber. Three different conditions including 0° C. to 85° C., −20° C. to 85° C., and −40° C. to 85° C. were utilized. These results are also tabulated in Table 5 below. SOG materials passed these conditions and were tested at three conditions in an environmental chamber, including −40° C. to 100° C., −40° C. to 125° C. and −40° C. to 150° C. for 16 cycles for each temperature range. These results are shown in Table 6 below. Although all of these SOG materials passed cycling at −40° C. to 100° C. and −40° C. to 125° C., some of them showed some cracks after −40° C. to 150° C. cycling. The coupling agent content impacts the cracking characteristics of SOG materials. Materials with a higher coupling agent content at times have some tendency to crack.

Figure 5:
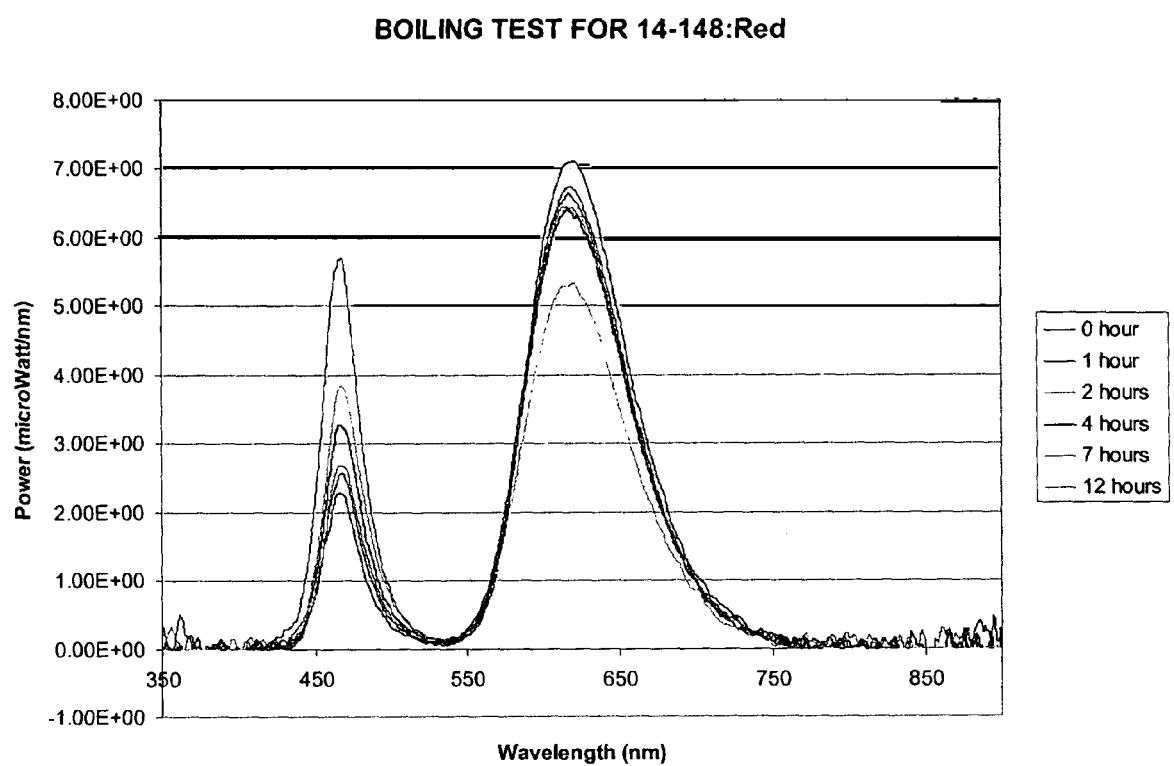
FIG. 5 shows the emission spectrum of red phosphor (SrS: $Eu^{+2}$) in a SOG material exposed to boiling water for 0, 1, 2, 4, 7, and 12 hrs.
Figure 6:
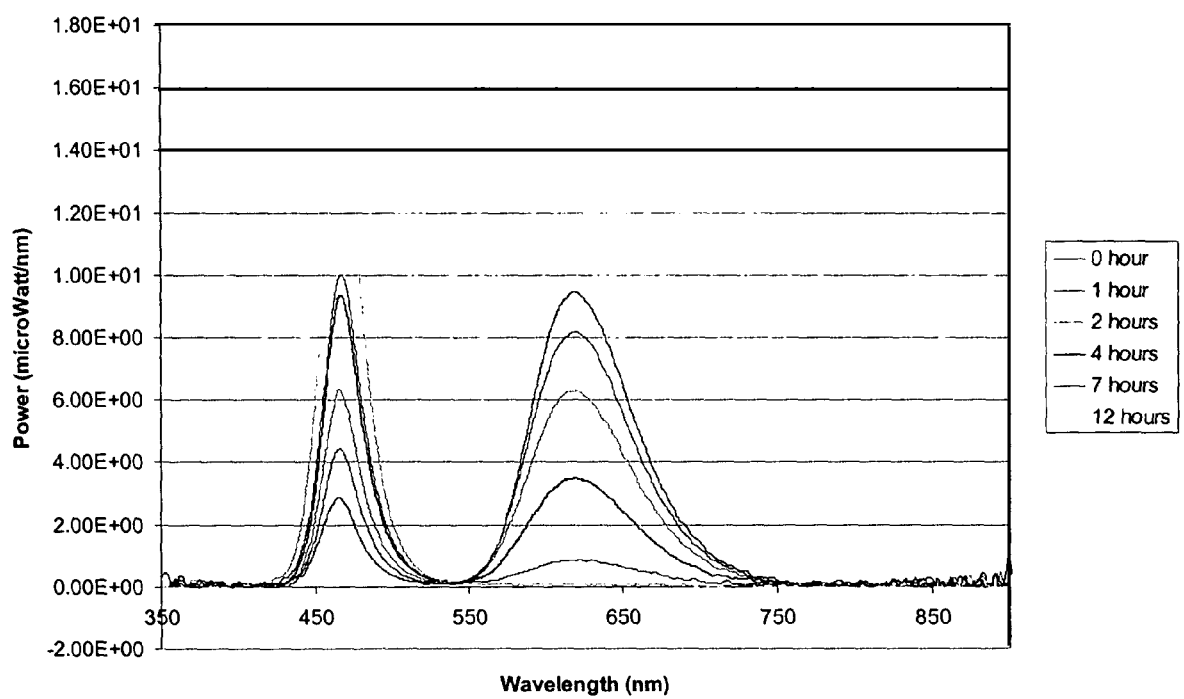
FIG. 6 shows the emission spectrum of red phosphor (SrS: $Eu^{+2}$) in a silicone material exposed to boiling water for 0, 1, 2, 4, 7, and 12 hrs.

Inserting fluorine into the structure of the SOG material of the present invention enhances its hydrophobicity, which decreases the moisture permeability of the material. This can be very important for encapsulating moisture sensitive materials such as a red, greenish yellow phosphor, or nano crystal materials. Fluorine also can increase the rigidity of the SOG material, which might cause some cracking. For example, SOG material made with 3-(heptafluoroisopropxy)propyltrimethoxysilane did not survive −40° C. to 100° C. temperature cycling without some cracking. When a SOG material was made from this material and octyltrimethoxysilane, the material survived temperature cycling at −40° C. to 100° C. and −40° C. to 125° C., but had some cracks when temperature cycled from −40° C. to 150° C. To solve the cracking issue, SOG material precursors were made from trifluoropropyltrimethyl silane and octyltrimethoxysilane. These materials survived the temperature cycling at all three conditions without any cracking, see Table 7 below. The moisture resistance of the fluorinated SOG material was compared with a silicone (polysiloxane polymer) material that is commonly being used as an encapsulant for LED applications. The SOG material and siloxane polymer were each loaded with 10% red phosphor SrS:Eu$^{+2}$. These materials were each then coated onto an LED and cured under identical conditions. These LEDs were all then immersed in boiling water. The intensity of the emission spectra of each LED was compared after 1, 2, 4, 7 and 12 hrs exposure to the boiling water. Results (see FIGS. 5 and 6 below) show that the emission spectra of the red phosphor encapsulated in siloxane disappeared after 7 hrs exposure to boiling water, whereas the red phosphor in the fluorinated SOG material of the present invention retained most of its emission power, even after 12 hrs exposure to boiling water. Different SOG material formulations were prepared from the reaction of octyltrimethoxysilane with diphenylsilanediol, with trifluroacetic acid as the catalyst. Aluminum sec-butoxide (3.5%) was added at the beginning of the reaction called "pre add", or added after the completion of reaction, which is called "post add". Drops of the SOG materials on glass slides were temperature cycled from −40° C. to 100° C., −40° C. to 125° C. and −40° C. to 150° C. in an environmental chamber. All drops survived the temperature cycling at these conditions without cracking, see Table 8 below.

More SOG materials were produced by reacting 3-Bis(3-hydroxypropyl)tetramethyldisiloxane, 3-Bis(4-hydroxybutyl)tetramethyldisiloxane, ethylene glycol, and propylene glycol (with and without diphenylsilanediol) with different alkyl-substituted trialkylsilanes. These SOG materials were then cast as drops on glass slides and cured. Temperature cycling at −40° C. to 100° C., −40° C. to 125° C., and −40° C. to −150° C. in an environmental chamber was conducted on these samples. None of these SOG materials cracked after temperature cycling under these conditions for 16 cycles, see Table 9 below.

Sol-gel spin-on glass (SOG) materials were synthesized using starting materials containing various different substituent groups. The alkyl groups utilized in these specific examples included: methyl, ethyl and propyl. Other groups included were trifluoropropyl, phenyl, hexyl, octyl, methacryloxylpropyltrimethoxysilyl, methacyloxylpropylmethyldimethoxysilyl and methylphenyldimethoxysilyl. The choice of the particular group utilized can have an impact on the hardness and glass transition temperatures of these materials. For example, SOG materials made by reacting methyltrimethoxysilane with diphenylsilanediol were hard and had higher glass transition temperatures than SOG materials made by reacting octyltrimethoxysilane and hexyltrimethoxysilane with diphenylsilanediol. Harder SOG materials with higher glass transition temperatures can have a greater tendency to crack when temperature cycled in an environmental chamber at temperatures from −40° C. to 150° C.

SOG materials made from these reactants were temperature cycled in an environmental chamber at three different temperature ranges, i.e. 0° C. to 85° C., −20° C. to 85° C. and −40° C. to 85° C. for 16 cycles for each temperature range. Screening of these SOG materials under these condition resulted in the selection of three especially preferred SOG materials, which were hexyltrimethoxysilane, octytrimethoxysilane, and methacyloxypropylmethyl-dimethoxysilane. Some of these SOG materials passed 0° C. to 85° C. and −20° C. to 85° C. cycling in the environmental chamber without cracking, but had some cracking after similar temperature cycling from −40° C. to 85° C. (See Table 5 below). For the hexyltrimethoxysilane SOG material 1 percent aluminum coupling agent (dibutoxyaluminoxytriethoxysilane) was added and the SOG material was cured in an oven at 110° C. for 1 hrs, then at 120° C. for 1 hr, and finally at 150° C. for 4 hrs. SOG materials produced from octyltrimethoxysilane and methacryloxypropylmethyl-dimethoxysilane with 3.5 percent of the same aluminum coupling agent were cured in an oven at 110° C. for 1 hr, then at 120° C. for 1 hr and again at 150° C. for 2 hrs.

These SOG materials were cast in 1" length×1" width, with a thickness of 0.039", polydimethylsiloxane molds. These molds were placed in a vacuum oven for 24 hrs, then were cured at 110° C. for 1 hr, and 120° C. for 36 hrs, followed by 6 hrs curing at 150° C. These slabs were cycled in an environmental chamber at temperatures from −40° C. to 160° C. for 25 cycles. No cracking and yellowing were observed during this cycling period. Similar samples were kept in an oven at 160° C. for one week, no cracking and yellowing was observed with these slabs during this period; see Table 10 below.

Differential Scanning Calorimetry (DSC) tests were conducted on these SOG materials to determine their respective glass transition temperatures ($T_g$). It was concluded that these SOG materials each had a different $T_g$, wherein the range was determined to be −19.2° C. to +47.3° C. SOG. Materials with a lower $T_g$ have a higher tolerance to cracking at sub ambient temperature (−40° C.). Such SOG materials can better survive the temperature shock at low (−40° C.) and high temperatures (up to 150° C.). It was concluded that the amount of coupling agent added to the material can have a significant effect on the $T_g$ of the SOG material. For example, a SOG material resulting from the reaction of diphenylsilanediol with methyacryloxypropyl-methyldimethoxysilane with 2.5%, 5%, and 7.5% dibutoxyaluminoxytriethoxysilane coupling agent had a $T_g$ of −19.2° C., −13.5° C., and −9.5° C., respectively. DSC data for these materials are shown in Table 11 below.

The thermal stability of the SOG materials of the subject invention was studied using a thermo gravimetric analyzer (TGA). In this study, the materials were heated from 30° C. to 900° C. in air and nitrogen, and the decomposition onset temperature and temperature related to 5% weight loss were each then measured. These SOG materials showed good thermal stability, as well as a decomposition temperature greater than 250° C. in air and nitrogen. The temperature related to 5% weight loss in air and nitrogen for each material is greater than 300° C. Thermal stability data are tabulated in Table 11 below.

Unless otherwise specified, alkyl is $C_1$ to $C_8$ alkyl; substituted alkyl is halogen substituted, aryl is phenyl, halogen substituted phenyl; all temperatures are Degrees Centigrade; all parts and percentages are by weight; all baking steps were carried out in an oven; and molecular weight is weight average molecular weight.

TABLE 1

| | | | | | Gel Permeation Chromatography | | |
|---|---|---|---|---|---|---|---|
| No. | ID | Starting Materials | Reaction time (hrs) | Viscosity cSts | W. Wt | No. Average M. Wt | Polydispersity |
| 1 | PTMS | Propyltrimethoxysilane + Diphenylsilanediol | 1.50 | 230 | 949 | 721 | 1.316 |
| 2 | ETES | Ethyltriethoxysilane + Diphenylsilanediol | 6.0 | 310 | 910 | 676 | 1.346 |
| 3 | PhTES | Phenyltriethoxysilane + Diphenylsilanediol | 1.5 | 830 | 850 | 676 | 1.225 |
| 4 | PFPhTES | Pentafluorophenyltriethoxysilane + Diphenylsilanediol | 1.5 | 1050 | 1115 | 880 | 1.267 |
| 5 | TFPTMS | Trifluoropropyltrimethoxysilane | 1.5 | 250 | NM | NM | NM |
| 6 | TMS | Tetramethoxysilane + Diphenylsilanediol | 1.5 | 1001 | 1270 | 836 | 1.520 |
| 7 | MTMS | Methyltrimethoxysilane + Diphenylsilanediol | 1.5 | 238 | 1099 | 761 | 1.444 |
| 8 | HTES | Hexyltrimethoxysilane + Diphenylsilanediol | 1.5 | 210 | 939 | 751 | 1.249 |
| 9 | DMTMDSE | Dimethyltetramethoxydisilylethylene + Diphenylsilanediol | 1.5 | 3600 | 22800 | 1651 | 13.807 |
| 10 | MPhDES | Methylphenyldiethoxysilane + Diphenylsilanediol | 1.5 | 195 | 561 | 524 | 1.070 |

TABLE 1-continued

| No. | ID | Starting Materials | Reaction time (hrs) | Viscosity cSts | Gel Permeation Chromatography | | |
|-----|----|--------------------|---------------------|----------------|--------|--------|----------------|
| | | | | | W. Wt | No. Average M. Wt | Polydispersity |
| 11 | MPhDES/ETES | Methylphenyldiethoxysilane/Ethyltriethoxysilane + Diphenylsilane diol | 1.5 | 3870 | 620 | 554 | 1.118 |
| 12 | HTMS/MTES | Hexyltrimethoxysilane/Methyltriethoxysilane + Diphenylsilane diol | 1.5 | 270 | 1092 | 775 | 1.410 |
| 13 | MAPTMS core | MAPTMS + Diphenylsilane diol | 8 | 157 | 1633 | 1100 | 1.485 |
| 14 | MAPTMS/ TFPTMS cladding | MAPTMS/TFPTMS + Diphenylsilane diol | 8 | 190 | NM | NM | NM |
| 15 | OTMS | OTMS + DPSDOL | 3 | 170 | 1261 | 906 | 1.391 |

TABLE 2

| Sample | Thickness μm | Thickness after exposure to solvent μm | Solvent used | Thickness changes in μm |
|--------|--------------|----------------------------------------|--------------|-------------------------|
| 1 | 9.5 | 9.5 | Acetone | 0.0 |
| 2 | 9.8 | 9.7 | Acetone | 0.1 |
| 3 | 9.8 | 9.8 | MeOH | 0.0 |
| 4 | 10.3 | 10.3 | MeOH | 0.0 |
| 5 | 9.7 | 9.5 | THF | 0.2 |
| 6 | 10.0 | 10.1 | THF | −0.1 |
| 7 | 9.7 | 9.9 | n-PA | −0.2 |
| 8 | 9.8 | 9.9 | n-PA | −0.1 |
| 9 | 10.1 | 10.1 | IPA | 0.0 |
| 10 | 9.7 | 9.9 | IPA | −0.2 |
| 11 | 9.5 | 9.6 | MEK | −0.1 |
| 12 | 10.3 | 10.2 | MEK | 0.1 |
| 13 | 10.3 | 10.3 | EOH | 0.0 |
| 14 | 10.1 | 10.2 | EOH | −0.1 |

TABLE 3

| No. | ID | Starting Materials | Reaction time (hrs) | Processing temperature | Refractive Index at 1550 nm | UV no absorption Up to |
|-----|----|--------------------|---------------------|------------------------|-----------------------------|------------------------|
| 1 | PTMS | Propyltrimethoxysilane + Diphenylsilane diol | 1.50 | 150° C./2 hrs 180° C./1 hr | 1.5310 | 285 nm |
| 2 | ETES | Ethyltriethoxysilane + Diphenylsilane diol | 6.0 | 150° C./2 hrs 180° C./1 hr | 1.5388 | 285 nm |
| 3 | PhTES | Phenyltriethoxysilane + Diphenylsilane diol | 1.5 | 150° C./2 hrs 180° C./1 hr | 1.5630 | 300 nm |
| 4 | PFPhTES | Pentafluorophenyltriethoxysilane + Diphenylsilane diol | 1.5 | 150° C./2 hrs 180° C./1 hr | 1.5056 | 300 nm |
| 5 | TFPTMS | Trifluoropropyltrimethoxysilane | 1.5 | 150° C./2 hrs 180° C./1 hr | 1.5522 | 310 nm |
| 6 | TMS | Tetramethoxysilane + Diphenylsilane diol | 1.5 | 150° C./2 hrs 180° C./1 hr | 1.5214 | 360 nm |
| 7 | MTES | Methyltriethoxysilane + Diphenylsilane diol | 1.5 | 150° C./2 hrs 180° C./1 hr | 1.5430 | 290 nm |
| 8 | HTMS 1% Al | Hexyltrimethoxysilane + Diphenyl silanediol | 1.5 | 150° C./2 hrs 180° C./1 hr | 1.5230 | 285 nm |
| 9 | HTMS 1% Al | Hexyltrimethoxysilane + Diphenyl silanediol | 1.5 | 150° C.(2 hr) 180° C.(6 hrs) | — | 285 nm |
| 10 | HTMS 2% Al | Hexyltrimethoxysilane + Diphenyl silanediol | 1.5 | 110° C.(1 hr) 120° C.(1 hr) 150° C.(2 hrs) | — | 285 nm |
| 11 | HTMS 3% Al | Hexyltrimethoxysilane + Diphenyl silanediol | 1.5 | 110° C.(1 hr) 120° C.(1 hr) 150° C.(2 hrs) | — | 285 nm |
| 12 | HTMS 4% Al | Hexyltrimethoxysilane + Diphenyl silanediol | 1.5 | 110° C.(1 hr) 120° C.(1 hr) 150° C.(2 hrs) | — | 285 nm |
| 13 | DMTMDSE | Dimethyltetramethoxydisilylethylene + Diphenylsilane diol | 1.5 | 150° C./2 hrs 180° C./1 hr | 1.5492 | 285 nm |
| 14 | MPhDES | Methylphenyldiethoxysilane + Diphenylsilane diol | 1.5 | 150° C./2 hrs 180° C./1 hr | 1.5544 | 285 nm |
| 15 | MPhSES/ETES | Methylphenyldiethoxysilane/ Ethyltriethoxysilane + Diphenylsilane diol | 1.5 | 150° C./2 hrs 180° C./1 hr | — | 285 nm |
| 16 | HTMS/MTES | Hexyltrimethoxysilane/ Methyltriethoxysilane + Diphenylsilane diol | 1.5 | 150° C./2 hrs 180° C./1 hr | — | 285 nm |

TABLE 3-continued

| No. | ID | Starting Materials | Reaction time (hrs) | Processing temperature | Refractive Index at 1550 nm | UV no absorption Up to |
|---|---|---|---|---|---|---|
| 17 | MAPTMS 10% Al | Methacryloxypropyltrimethoxysilane + Diphenylsilane diol | 8 | 150° C./2 hrs 180° C./1 hr | 1.5366 | 400 nm |
| 18 | MAPTMS 5% Al | Methacryloxypropyltrimethoxysilane + Diphenylsilane diol | 8 | 110° C.(1 hr) 120° C.(1 hr) 150° C.(2 hrs) | — | 400 nm |
| 19 | MAPTMS 2.5 Al | Methacryloxypropyltrimethoxysilane + Diphenylsilane diol | | 110° C.(1 hr) 120° C.(1 hr) 150° C.(2 hrs) | — | 400 nm |
| 20 | MAPTMS/ TFPTMS cladding | MAPTMS/TFPTMS + Diphenylsilane diol | 8 | 150° C./2 hrs 180° C./1 hr | 1.5248 | 380 nm |
| 21 | OTMS 1% Al | Octyltrimethoxysilane + diphenylsilanediol | 3 | 150° C./2 hrs 180° C./6 hrs | — | 285 nm |
| 22 | OTMS 2.5% Al | Octyltrimethoxysilane + diphenylsilanediol | 3 | 110° C.(1 hr) 120° C.(1 hr) 150° C.(2 hrs) | — | 285 nm |
| 23 | OTMS 5% Al | Octyltrimethoxysilane + diphenylsilanediol | 3 | 110° C.(1 hr) 120° C.(1 hr) 150° C.(2 hrs) | — | 285 nm |
| 24 | OTMS 7.5% Al | Octyltrimethoxysilane + diphenylsilanediol | 3 | 110° C.(1 hr) 120° C.(1 hr) 150° C.(2 hrs) | — | 285 nm |
| 25 | HTMS/MAPTMS | HTMS/MAPTMS + Diphenylsilane diol | | 150° C./2 hrs 180° C./1 hr | — | 330 nm |
| 26 | OPTMS/ MAPTMS | OPTMS/MAPTMS + Diphenylsilane diol | | | — | 320 nm |
| 27 | MAPDMMS | MAPDMMS + Diphenylsilanediol | | | — | 285 nm |

The highest number in parenthesis is the softest.

TABLE 4

Corrected Transmittance (%) of Coated Borosilicate Glass Wafer after 5 hrs Exposure to 365 nm UV Light at 45 mW/cm² intensity

| Material | T after 0 hrs exposure | T after 5 hrs exposure | T after 10 hrs exposure | T after 15 hrs exposure | T after 20 hrs exposure | T after 25 hrs Exposure | Overall Transmittance loss (%) |
|---|---|---|---|---|---|---|---|
| Irgacure ™ 184 (3%) | 83 | 84.6 | 81.8 | 81.8 | 81.8 | 81.8 | 1 |
| Irgacure ™ 184 (1%) | 83.1 | 84.6 | 81.8 | 81.8 | 81.8 | 81.8 | 1 |
| Irgacure ™ 184:Irgacure ™ 819 (2:1) | 83.1 | 84.6 | 78.8 | 81.8 | 81.8 | 81.8 | 1 |

TABLE 5

Hardness and Temperature Cycling of Cured SOG Materials at Different Conditions

| ID | Starting Materials | Hardness #oscillation/# second (rank) | Temperature Cycling (16 cycles) | | |
|---|---|---|---|---|---|
| | | | 0 to 85° C. | −20 to 85° C. | −40 to 85° C. |
| PTMS | Propyltrimethoxysilane + Diphenylsilane diol | 139/198 | P | P | C |
| ETES | Ethyltriethoxysilane + Diphenylsilane diol | 133/188 | P | P | C |
| PhTES | Phenyltriethoxysilane + Diphenylsilane diol | 158/224 | C | C | C |
| PFPhTES | Pentafluorophenyltriethoxysilane + Diphenylsilane diol | 149/211 | C | C | C |
| TFPTMS | Trifluoropropyltrimethoxysilane | 126/180 | P | C | C |
| TMS | Tetramethoxysilane + Diphenylsilane diol | 153/217 | C | C | C |
| MTES | Methyltriethoxysilane + Diphenylsilane diol | 151/214 | C | C | C |
| HTMS 1% Al | Hexyltrimethoxysilane + Diphenylsilanediol | 62/89 | P | P | Minor cracking |
| HTMS 1% Al | Hexyltrimethoxysilane + Diphenylsilanediol | — | P | P | P |
| HTMS 2% Al | Hexyltrimethoxysilane + Diphenylsilanediol | — | P | P | C |

TABLE 5-continued

Hardness and Temperature Cycling of Cured SOG Materials at Different Conditions

| ID | Starting Materials | Hardness #oscillation/# second (rank) | Temperature Cycling (16 cycles) | | |
|---|---|---|---|---|---|
| | | | 0 to 85° C. | −20 to 85° C. | −40 to 85° C. |
| HTMS 3% Al | Hexyltrimethoxysilane + Diphenylsilanediol | — | P | P | C |
| HTMS 4% Al | Hexyltrimethoxysilane + Diphenylsilanediol | — | P | P | C |
| DMTMDSE | Dimethyltetramethoxydisilylethylene + Diphenylsilane diol | 138/197 | — | | |
| MPhDES | Methylphenyldiethoxysilane + Diphenylsilane diol | 145/206 | P | P | C |
| MPhSES/ETES | Methylphenyldiethoxysilane/Ethyltriethoxysilane + Diphenylsilane diol | 153/224 | P | C | C |
| HTMS/MTES | Hexyltrimethoxysilane/Methyltriethoxysilane + Diphenylsilane diol | 196/277 | P | P | C |
| MAPTMS 10% Al | Methacryloxypropyltrimethoxysilane + Diphenylsilane diol | 155/219 | P | C | C |
| MAPTMS 5% Al | Methacryloxypropyltrimethoxysilane + Diphenylsilane diol | | P | C | C |
| MAPTMS 2.5Al | Methacryloxypropyltrimethoxysilane + Diphenylsilane diol | | P | C | C |
| MAPTMS/TFPTMS cladding | MAPTMS/TFPTMS + Diphenylsilane diol | 151/214 | P | C | C |
| OTMS 1% Al | Octyltrimethoxysilane + diphenylsilanediol | | P | P | P |
| OTMS 2.5% Al | Octyltrimethoxysilane + diphenylsilanediol | | P | P | P |
| OTMS 5% Al | Octyltrimethoxysilane + diphenylsilanediol | | P | P | C |
| OTMS 7.5% Al | Octyltrimethoxysilane + diphenylsilanediol | | P | P | C |
| HTMS/MAPTMS | HTMS/MAPTMS + Diphenylsilane diol | | P | P | C |
| OPTMS/MAPTMS | OPTMS/MAPTMS + Diphenylsilane diol | | P | P | C |
| MAPDMMS | MAPDMMS + Diphenylsilanediol | | P | P | P |

Pendulum Hardness (ASTM D 4366 - 95 Method A, Konig Test)
Lowest number = softest material
P = Passed
C = Cracked
TMS = Tetraethoxysilane
MTES = Methyltriethoxysilane
ETES = Ethyltriethoxysilane
PTMS = Propyltrimethoxysilane
PhTMS = Phenyltrimethoxysilane
PFPhTES = Pentafluorophenyltriethoxysilane
TFPTMS = Trifluoropropyltrimethoxysilane
HTMS = Hexyltrimethoxysilane
OTMS = Octyltrimethoxysilane
DMTMDSE = Dimethyltetramethoxysilyethylene
MAPTMS = Methacryloxypropyltrimethoxysilane
MAPMDMS = Methacyloxypropylmethyldimethoxysilane

TABLE 6

Cracking characteristics (−40° C. to 100° C., −40° C. to 125° C. and −40° C. to 150° C.) of sol gel materials with different coupling agent (dibutoxyaluminoxytriethoxysilane) content

| | Sample | Material | % Al | −40° C. to 100° C. | −40° C. to 125° C. | −40° C. to 150° C. | −40° C. to 180° C. |
|---|---|---|---|---|---|---|---|
| 1 | 14-142F | 80:20 OTMS:PTMS | 2.5 | OK | OK | 2 drops Delaminated | All drops cracked |
| 2 | 14-142E | 80:20 OTMS:PTMS | 1 | OK | OK | OK | One drop cracked |
| 3 | 14-136D | 75:25 OTMS:HTMS | 2.5 | OK | OK | 3 drops delaminated | All Cracked |
| 4 | 14-136C | 75:25 OTMS:HTMS | 1.0 | OK | OK | OK | OK |
| 5 | 14-144A | 90:10 OTMS:HTMS | 1 | OK | OK | OK | OK |
| 6 | 14-144B | 90:10 OTMS:HTMS | 2.5 | OK | OK | One drop delaminated | All drops cracked |
| 7 | 14-144C | 50:50 OTMS:HTMS | 1 | OK | OK | OK | OK |
| 8 | 14-140A | 50:50 OTMS:HTMS | 1 | OK | OK | OK | OK |
| 9 | 14-140B | 50:50 OTMS:HTMS | 2.5 | OK | OK | OK | 3/5 drops cracked |
| 10 | 14-143D | 25:75 OTMS:HTMS | 2.5 | OK | OK | OK | All drop cracked |

TABLE 7

Cracking Characteristics of fluorinated and non-fluorinated sol-gel drops coated on glass slides

|   | Sample | Material | % Al | −40° C. to 100° C. | −40° C. to 125° C. | −40° C. to 150° C. |
|---|---|---|---|---|---|---|
| 1 | 14-147 | HFPOPTMS | 3.5 | Material had cracks before test | Cracked | Cracked |
| 2 | 14-148 | OTMS + HFPOPTMS 75:25 | 3.5 | Passed | Passed | — |
| 3 | 14-149 | OTMS:TFPTMS 75:25 | 3.5 | Passed | Passed[ | Passed |
| 4 | 14-151 | HTMS:OTSM 90:10 | 1 | Passed | Passed | Passed |
| 5 | 14-156 | OTMS:GPTMS 90:10 | 3.5 | Passed | Passed | Passed |
| 7 | 14-158 | OTMS:GPTMS 75:25 | 2.5 | Passed | Passed | Passed |
| 8 | 14-162 | OTMS | 3.5 | Passed | Passed | Passed |

TABLE 8

Cracking characteristics of sol gel materials containing 3.6% Aluminum sec-butoxide added as post add or pre add to the sol-gel precursors

|   | Sample | Material | % Al | −40° C. to 100° C. | −40° C. to 125° C. | −40° C. to 150° C. |
|---|---|---|---|---|---|---|
| 1 | 14-164* | OTMS with TFAA, Al post add | 3.5 | Passed | Passed | passed |
| 2 | 14-168 | OTMS with 3.5 Al Tri-tertButoxide pre-add | 3.5 | Passed | Passed | Passed |
| 3 | 14-169 | OTES with 3.5 Al Tri-tertbutoxide pre-add | 3.5 | Passed | Passed | Passed |
| 4 | 14-170 | OTMS with 3.5% Al tri-tertButoxide pre-add | 3.5 | Passed | Passed | Passed |

TABLE 9

Cracking characteristics of sol-gel materials made with different diols

| No | Note book No. | Composition | Al Content (%) | −40° C. to 100° C. | −40° C. to 125° C. | −40° C. to 150° C. |
|---|---|---|---|---|---|---|
| 1 | 21-187 | 3BHPTMS + HTMS | 3.5 | Passed | Passed | Passed |
| 2 | 21-191 | 3BHBTMS + TMS + PTMS | 3.5 | Passed | Passed | Passed |
| 3 | 21-192 | 3BHBTMS + PTMS | 3.5 | Passed | Passed | Passed |
| 4 | 21-194 | DPSDL + 3BHBTMS + OTMS | 3.5 | Passed | Passed | Passed |
| 5 | 21-196 | DPSDL + 3BHPTMS + HTMS | 3.5 | Passed | Passed | Passed |
| 6 | 21-197 | DPSDL + 3BHBTMS | 3.5 | Passed | Passed | Passed |
| 7 | 21-198 | DPSDL + EG + HTMS | 3.5 | Passed | Passed | Passed |
| 8 | 21-199 | DPSDOL + PG + HTMS | 3.5 | Passed | Passed | Passed |

3BHPTMS = 3-Bis(3-hydroxylpropyl)tetramethyldisiloxane,
3BHBTMS = 3-Bis(4-hydroxylbutyl)tetramethyldisiloxane,
PTMS = Propyltrimethoxysilane,
TMS = Tetramethoxysilane,
DPSDL = Diphenylsilanediol,
OTMS = Octyltrimethoxysilane,
HTMS = Hexyltrimethoxysilane,
EG = Ethylene glycol,
PG = Propylene glycol

TABLE 10

Cracking and yellowing characteristic of different SOG materials

| No | Note book No. | Composition | Al Content (%) | Temp. cycling from −40° C. to 150° C. for 25 cycles | | Aging at 160° C. for 1 week | |
|---|---|---|---|---|---|---|---|
|   |   |   |   | Cracking | Yellowing | Cracking | Yellowing |
| 1 | 21-198 | DPSDL + EG + HTMS | 2 | NC | NY | NC | NY |
| 2 | 21-198 | DPSDL + EG + HTMS | 3.5 | NC | NY | NC | NY |
| 3 | 21-199 | DPSDL + PG + HTMS | 2 | NC | NY | NC | NY |
| 4 | 21-199 | DPSDL + PG + HTMS | 3.5 | NC | NY | NC | NY |
| 5 | 21-203 | DPSDL + MPhDMS | 2 | NC | NY | NC | NY |
| 6 | 21-203 | DPSDL + MPhDMS | 3.5 | NC | NY | NC | NY |
| 7 | 21-206 | DPSDL + DPDMS | 2 | NC | NY | NC | NY |
| 8 | 21-206 | DPSDL + DPDMS | 3.5 | NC | NY | NC | NY |

TABLE 10-continued

Cracking and yellowing characteristic of different SOG materials

| No | Note book No. | Composition | Al Content (%) | Temp. cycling from −40° C. to 150° C. for 25 cycles Cracking | Yellowing | Aging at 160° C. for 1 week Cracking | Yellowing |
|---|---|---|---|---|---|---|---|
| 9 | 21-208 | DPSDL + PMDMS | 2 | NC | NY | NC | NY |
| 10 | 21-208 | DPSDL + PMDMS | 3.5 | NC | NY | NC | NY |

NC = No Cracking,
NY = No Yellowing,
DPSDL = Diphenylsilanediol,
EG = Ethylenegylcol,
HTMS = Hexyltrimethoxysilane
PG = Propyleneglycol,
MPhDMS = Methylphenyldimethoxysilane,
DPDMS = Diphenyldimethoxysilane,
PMDMS = Propylmethyldimethoxysilane

TABLE 11

Differential Scanning Calorimetry and Thermo gravimetric Analysis of SOG Materials

| | Material | | Decomposition Temp. C. in Air and (Nitrogen) | Temperature related to 5% weight loss in air and (Nitrogen) | Glass Transition Temperature |
|---|---|---|---|---|---|
| 1 | PTMS | Propyltriethoxysilane + Diphenylsilane diol | 203.6(212.6) | 262.5(256.3) | −8.1 |
| 2 | ETES | Ethyltriethoxysilane + Diphenylsilane diol | | (274.3) | 47.3 |
| 3 | PhTMS | Phenyltriethoxysilane + Diphenylsilane diol | 217.4(212.2) | 288.1(282.9) | −16.7 |
| 4 | PFPhTES | Pentafluorophenyltriethoxysilane + Diphenylsilane diol | 201.8(207.0) | 259.1(296.4) | −8.98 |
| 5 | TFPTMS | Trifluoropropyltrimethoxysilane | | | −12.6 |
| 6 | TMS | Tetramethoxysilane + Diphenylsilane diol | 230.5(219.1) | 303.9(307.1) | 23.5 |
| 7 | MTES | Methyltrimethoxysilane + Diphenylsilane diol | 233.2(232.6) | 303.9(307.1) | −8.4 |
| 8 | HTMS + 2% Al | Hexyltrimethoxysilane + Diphenylsilane | 265.9(266.4) | 295.2(320.9) | −11.9 |
| 9 | HTMS + 3% Al | Hexyltrimethoxysilane + Diphenylsilane | 232.8( ) | 251.9(227.2) | −16.4 |
| 10 | HTMS + 4% Al | Hexyltrimethoxysilane + Diphenylsilane | 259.9(338.4) | 245.5(252.5) | −15.1 |
| 11 | HTMS + 5% | Hexyltrimethoxysilane + Diphenylsilane | 269.1(214.0) | 232(265.5) | −15.3 |
| 12 | HTMS + MAPTMS | | 298.1(329.8) | 255.0(278.2) | 14.6 |
| 13 | DMTMDSE | Dimethyltetramethoxydisilylethylene + Diphenylsilane diol | 191.6(286.7) | 260.2(353.7) | 27.2 |
| 14 | MPhDMS | Methylphenyldimethoxysilane + Diphenylsilane diol | 219.2(222.0) | 334.3(314.3) | −20.5 |
| 15 | MPhSMS/ETES | Methylphenyldimethoxysilane/Ethyltriethoxysilanr + Diphenylsilane diol | 260.2(270.8) | 338.0(314.5) | −18.3 |
| 16 | HTMS/MTES | Hexyltrimethoxysilane/Methyltriethoxysilane + Diphenylsilane diol | 264.3(317.0) | 299.3(324.8) | −7.7 |
| 17 | OTMS | Octytrimethoxysilane + Diphenylsilane diol | 297.23(223.5) | 283.0(311.8) | 2.13 |
| 18 | OTMS + 2.5% | Octytrimethoxysilane + Diphenylsilane diol | 308.3(277.8) | 276(272.5) | −11.1* |
| 19 | OTMS + 5% | Octytrimethoxysilane + Diphenylsilane diol | 261.3(268.7) | 274.2(292.4) | −11.1* |
| 20 | MAPTMS 0% Al | 3-Mathacryloxypropyltrimethoxysilane + Diphenylsilane diol | 267.3(267.1) | 324.9(329.1) | 18.9 |
| 21 | MAPTMS 2.5% | 3-Mathacryloxypropyltrimethoxysilane + Diphenylsilane diol | 257.7(204.7) | 293.4(307.4) | −13.9 |
| 22 | MAPTMS 5% | 3-Mathacryloxypropyltrimethoxysilane + Diphenylsilane diol | 293.5(336.6) | 283(308.8) | −4.7 |
| 23 | MAPTMS 7.5% | 3-Mathacryloxypropyltrimethoxysilane + Diphenylsilane diol | 229.6(277.9) | 325.3(332.9) | −5.7 |
| 24 | MAPTMS 10% Al | 3-Mathacryloxypropyltrimethoxysilane + Diphenylsilane diol | 336(345.7) | 304.4(320.4) | −11.8 |
| 25 | MAPTMS/OTMS | 3-Mathacryloxypropyltrimethoxysilane/Octytrimethoxysilane + Diphenylsilane diol | (254.2(268.7) | 290.6(292.2) | −6.6 |
| 26 | MAPTMS/TFPTAMS | 3-Mathacryloxypropyltrimethoxysilane + Trifluoropropyltrimethoxysilane + Diphenyl silanediol | 311.6(314.6) | 288.9(290.3) | −5.9 |
| 27 | MAPDMMS 2.5% Al | 3-methacryloxypropyldimethoxymethylsilane + Diphenyl silanediol | 305.2(277.8) | 287.8(273.0) | −19.2 |
| 28 | MAPDMMS 5% Al | 3-methacryloxypropyldimethoxymethylsilane + Diphenyl silanediol | 261.3(283.1) | 274.2(266.0) | −13.5 |
| 29 | MAPDMMS 7.5% Al | 3-methacryloxypropyldimethoxymethylsilane + Diphenyl silanediol | 255.0(290.3) | 268.1(268.7) | −9.5 |

*Containing 10% phosphor

The invention claimed is:

1. A process for producing a non-aqueous sol-gel spin-on glass material comprising a hybrid glass/polymer material, by reacting an alkyl trialkoxysilane, an alkyl dialkoxysilane or a dialkyl dialkoxysilane with a silane diol, wherein said alkyl group has from 1 to 8 carbon atoms, wherein the reaction of the alkyl trialkoxysilane, alkyl dialkoxysilane or dialkyl dialkoxysilane silane with the silane diol is carried out in a non-aqueous medium in the presence of a calalyst, wherein the catalyst is selected from: a) a tin catalyst or b) a dibutyltin diluarate, titanium isopropoxide, acetic acid or tri-fluroroacetic acid catalyst.

2. The process of claim 1, wherein the silane diol is a diphenylsilanediol, a 1,3-Bis (3-hydroxypropyl) tetramethyldisiloxane, a 1,3-Bis (4-hydroxybutyl) tetramethyldisiloxane, a fluorinated silane diol, or a mixture of one or more of these silane diols.

3. The process of claim 1, wherein the alkyl group is replaced with a methacyloxypropyl, acryloxypropyl, or epoxy moiety.

4. The process of claim 1, wherein the trialkoxysilane has 1 $C_1$ to $C_8$ alkyl or methacryloxypropyl groups on the same molecule and the dialkoxysilane has 1 to 2 $C_1$ to $C_8$ alkyl or methacryloxypropyl groups on the same molecule.

5. The process of claim 1, further comprising adding a UV light blocking material and/or an oxygen scavenger.

6. The process of claim 1, further comprising adding a light-scattering material.

7. The process of claim 1, further comprising adding a coupling agent.

8. The process of claim 7, wherein the coupling agent is a dibutoxyaluminoxytriethoxysilane, a mixture of zirconium isopropoxide and methacrylic acid, or another transition metal propoxide.

9. A non-aqueous sol-gel spin-on glass material comprising a hybrid glass/polymer material containing a phosphor dopant, which consists essentially of a YAG base phosphor or moisture sensitive phosphor nano-particles, said sol-gel spin-on-glass material selected from the group having the following formulas:

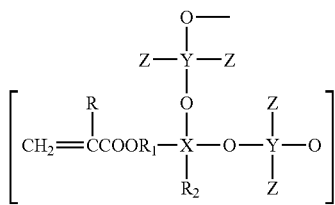

Formula I

Where R = Hydrogen, $C_1$-$C_8$ Alkyl, Halogenated $C_1$-$C_8$ Alkyl or Glycidyloxyalkyl

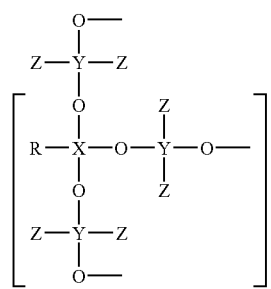

Formula II

Where R = Methacryloxyalkyl, Acryloxyalkyl or Glycidyloxyalkyl
$R_1$ = Phenyl or Substituted Phenyl, Ethyl, Propyl or another $C^1$ to $C_8$ Alkyl, or Trifluoroalkyl
X, Y = Si, Ti, Ge or Sn
Z = Alkyl, Substituted Alkyl, Phenyl, Substituted Phenyl

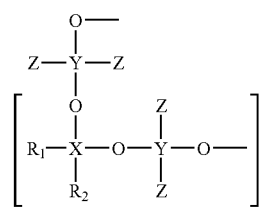

Formula III

Where $R_1$ = Phenyl, or Substituted Phenyl, Ethyl, Propyl or another $C_1$ to $C_8$ Alkyl, or Trifluoroalkyl
$R_2$ = Methyl, Ethyl or another $C_1$ to $C_8$ Alkyl
X, Y = Si, Ge, Ti, Sn
Z = Alkyl, Substituted Alkyl, Phenyl, Substituted Phenyl

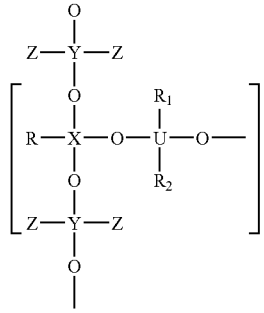

Formula IV

Where R = Methacryloxyalkyl, Acryloxyalkyl or Glycidyloxyalkyl
$R_1$ = Phenyl of Substituted Phenyl, Ethyl, Propyl or another $C_1$ to $C_8$ Alkyl, or Trifluoroalkyl
$R_2$ = Methyl, Ethyl or another $C_1$ to $C_8$ Alkyl or Phenyl
X, U, Y = Si, Ge, Ti, or Sn
Z = Alkyl, Substituted Alkyl, Phenyl, Substituted Phenyl.

10. The non-aqueous sol-gel spin-on glass material of claim 9, having the following formula:

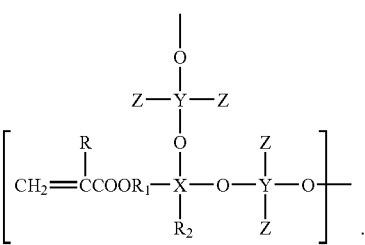

Formula I

11. The non-aqueous sol-gel spin-on glass material of claim 9, having the following formula:

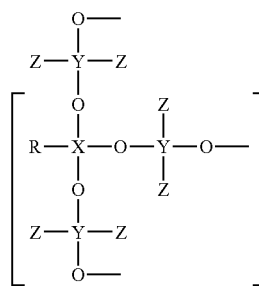

Formula II

12. The non-aqueous sol-gel spin-on glass material of claim 9, having the following formula:

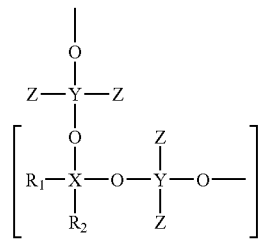

Formula III

13. The non-aqueous sol-gel spin-on glass material of claim 9 having the following formula:

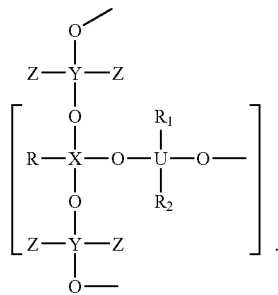

Formula IV

14. The non-aqueous sol-gel spin-on glass material of claim 9, further comprising a UV light blocking material and/or an oxygen scavenger.

15. The non-aqueous sol-gel spin-on glass material of claim 9, further comprising a light-scattering material.

16. A process for producing the non-aqueous sol-gel spin-on glass material of claim 9, the process comprising reacting an alkyl substituted trialkoxysilane, an alkyl substituted dialkoxysilane or a dialkyl substituted dialkoxysilane with a silane diol, wherein said alkyl group has from 1 to 8 carbon atoms, wherein the reaction of the alkyl substituted trialkoxysilane, alkyl substituted dialkoxysilane or dialkyl substituted dialkoxysilane silane with the silane diol is carried out in a non-aqueous medium in the presence of a catalyst, the process further comprising adding to said sol-gel spin-on glass material a phosphor dopant, which consists essentially of a YAG base phosphor or moisture sensitive phosphor nanoparticles.

* * * * *